United States Patent
Kwag et al.

(10) Patent No.: US 9,735,197 B1
(45) Date of Patent: Aug. 15, 2017

(54) IMAGE SENSOR INCLUDING A TRANSFER TRANSISTOR HAVING A VERTICAL CHANNEL AND PIXEL TRANSISTORS HAVING THIN FILM CHANNELS

(71) Applicant: SK hynix Inc., Gyeonggi-do (KR)

(72) Inventors: Pyong-Su Kwag, Gyeonggi-do (KR);
Min-Ki Na, Gyeonggi-do (KR);
Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/333,856

(22) Filed: Oct. 25, 2016

(30) Foreign Application Priority Data

May 17, 2016 (KR) ........................ 10-2016-0060143

(51) Int. Cl.
*H01L 27/146* (2006.01)
*H01L 27/148* (2006.01)

(52) U.S. Cl.
CPC .. *H01L 27/14812* (2013.01); *H01L 27/14616* (2013.01); *H01L 27/14643* (2013.01)

(58) Field of Classification Search
CPC ......... H01L 27/14643; H01L 27/14616; H01L 27/14612; H01L 27/14614
See application file for complete search history.

(56) References Cited

U.S. PATENT DOCUMENTS

| 9,331,112 | B2 | 5/2016 | Koyama et al. |
| 2014/0211056 | A1 | 7/2014 | Fan |
| 2015/0279899 | A1* | 10/2015 | Kim .................... H01L 27/1463 250/208.1 |
| 2017/0040364 | A1* | 2/2017 | Oh .................... H01L 27/14614 |

* cited by examiner

*Primary Examiner* — Latanya N Crawford
(74) *Attorney, Agent, or Firm* — IP & T Group LLP

(57) ABSTRACT

Image sensors are provided. The image sensor may include a photodiode formed in a substrate, a lower interlayer dielectric layer formed over the substrate, a drive transistor gate electrode formed over the lower interlayer dielectric layer, and a transfer transistor gate electrode including an upper portion and a lower portion. The upper portion of the transfer transistor gate electrode may be formed over the drive transistor gate electrode. The lower portion of the transfer transistor gate electrode may be formed in a pillar shape and vertically extends from the upper portion of the transfer transistor gate electrode through the drive transistor gate electrode and the lower interlayer dielectric layer into the substrate.

19 Claims, 25 Drawing Sheets

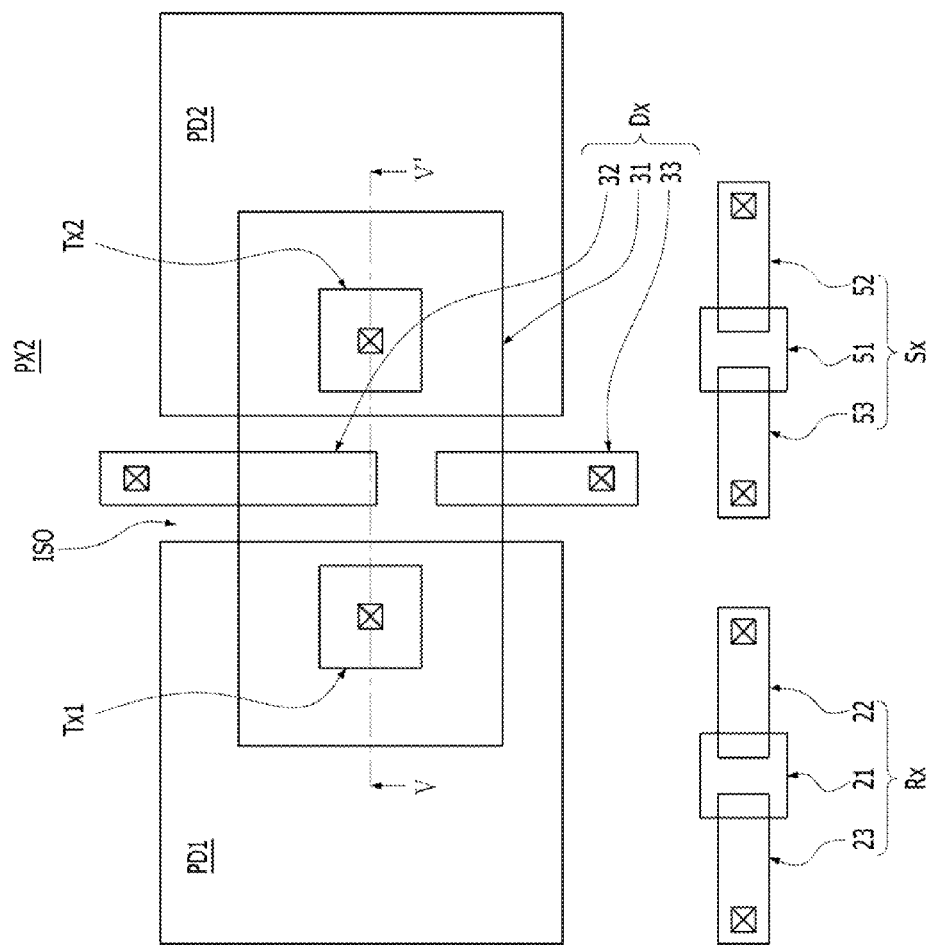

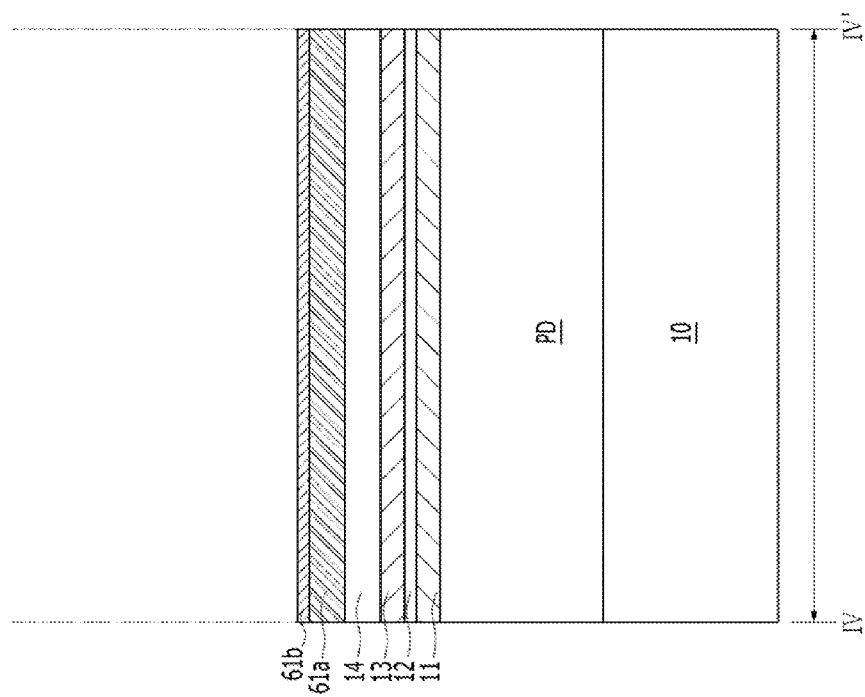

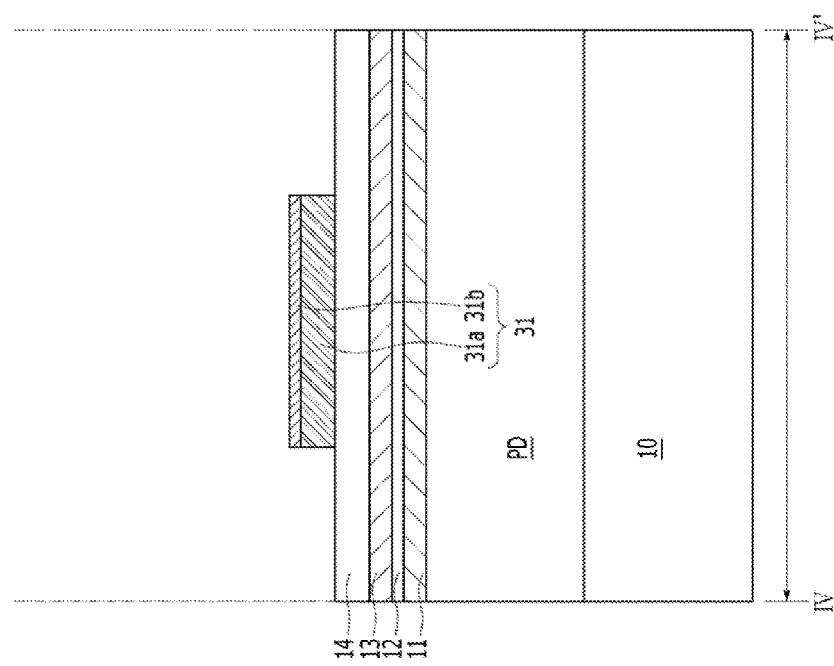

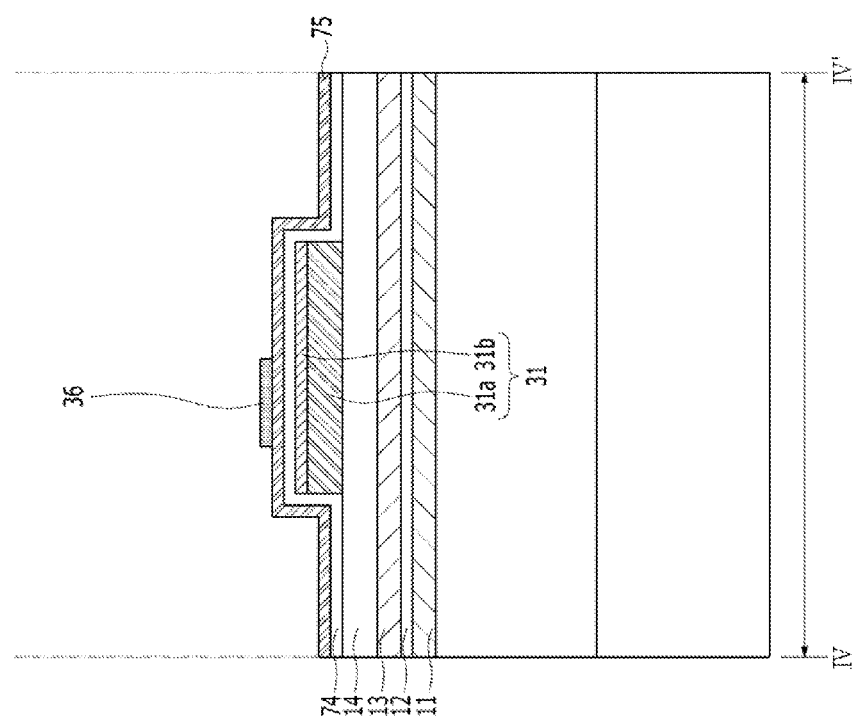

IMAGE SENSOR INCLUDING A TRANSFER TRANSISTOR HAVING A VERTICAL CHANNEL AND PIXEL TRANSISTORS HAVING THIN FILM CHANNELS

CROSS-REFERENCE TO RELATED APPLICATIONS

The present application claims priority to Korean Patent Application No. 10-2016-0060143, filed on May 17, 2016, which is incorporated herein by reference in its entirety.

BACKGROUND

1. Field

Exemplary embodiments of the inventive concepts relate to an image sensor including a transfer transistor having a vertical channel, and pixel transistors having thin film channels.

2. Description of the Related Art

An image sensor is a device that transforms an optical image into electrical signals. The recent advancement in computer and communication industries increases the demand for high-degree image sensors with improved performance in diverse fields such as digital cameras, camcorders, Personal Communication Systems (PCS), game players, cameras for security purposes, medical micro cameras, robots and so forth.

High-performance image sensors require wide-area photodiodes and fast transistors.

SUMMARY

Embodiments of the inventive concepts provide an image sensor including a transfer transistor having a vertical channel.

Embodiments of the inventive concepts provide an image sensor including pixel transistors having reversed thin film channels.

Embodiments of the inventive concepts provide a method for fabricating an image sensor including a transfer transistor having a vertical channel.

Embodiments of the inventive concepts provide a method for fabricating an image sensor including pixel transistors having reversed thin film channels.

The objectives of the inventive concepts are not limited to the above-mentioned objectives, and it is obvious to those skilled in the art that there may be other objectives that are not mentioned above.

In accordance with an embodiment of the inventive concepts, an image sensor may include a photodiode formed in a substrate, a lower interlayer dielectric layer formed over the substrate, a drive transistor gate electrode formed over the lower interlayer dielectric layer, and a transfer transistor gate electrode including an upper portion and a lower portion. The upper portion of the transfer transistor gate electrode may be formed over the drive transistor gate electrode. The lower portion of the transfer transistor gate electrode may be formed in a pillar shape and vertically extends from the upper portion of the transfer transistor gate electrode through the drive transistor gate electrode and the lower interlayer dielectric layer into the substrate.

The image sensor may further include a surface p-type region formed in the substrate, a buffer dielectric layer provided between the substrate and the lower interlayer dielectric layer and including a silicon oxide, and a pad dielectric layer provided between the lower interlayer dielectric layer and the buffer dielectric layer and including a silicon nitride.

The drive transistor gate electrode may include a drive transistor main gate electrode, and a drive transistor capping gate electrode directly formed on the drive transistor main gate electrode.

The drive transistor main gate electrode may include a doped polysilicon. The drive transistor capping gate electrode may include a re-crystallized doped polysilicon.

The image sensor may further include a transfer transistor gate insulation layer that surrounds the lower portion of the transfer transistor gate electrode and further extend under the upper portion of the transfer transistor gate electrode, and a transfer transistor channel layer formed under the transfer transistor gate insulation layer. The drive transistor capping gate electrode and the transfer transistor channel layer may include the same material and are continuously connected to each other.

The transfer transistor channel layer may include a re-crystallized doped polysilicon.

The image sensor may further include a drive transistor gate insulation layer that is conformally formed over an upper surface and a sidewall of the drive transistor gate electrode, a drive transistor channel layer that is formed over the drive transistor gate insulation layer, and a drive transistor source electrode and a drive transistor drain electrode formed over the drive transistor channel layer and spaced apart from each other.

The image sensor may further include a drive transistor protective pattern that is formed over the drive transistor channel layer and between the drive transistor source electrode and the drive transistor drain electrode.

The drive transistor gate insulation layer may further extend to conformally cover an upper surface and a sidewall of the upper portion of the transfer transistor gate electrode.

The image sensor may further include a reset transistor and a select transistor formed over the lower interlayer dielectric layer. The reset transistor may include a reset transistor gate electrode formed over the lower interlayer dielectric layer, a reset transistor gate insulation layer that covers an upper surface of a sidewall of the reset transistor gate electrode, a reset transistor channel layer formed over the reset transistor gate insulation layer, and a reset transistor source electrode and a reset transistor drain electrode formed over the reset transistor channel layer and spaced apart from each other. The reset transistor gate electrode may include a stack of a reset transistor main gate electrode and a reset transistor capping gate electrode. The select transistor may include a select transistor gate electrode formed over the lower interlayer dielectric layer, a select transistor gate insulation layer that covers an upper surface of a sidewall of the select transistor gate electrode, a select transistor channel layer formed over the select transistor gate insulation layer, and a select transistor source electrode and a select transistor drain electrode formed over the select transistor channel layer and spaced apart from each other. The select transistor gate electrode may include a stack of a select transistor main gate electrode and a select transistor capping gate electrode.

Each of the reset transistor main gate electrode and the select transistor main gate electrode may include a doped polysilicon. Each of the reset transistor capping gate electrode and the select transistor capping gate electrode may include a re-crystallized doped polysilicon.

The reset transistor may further include a reset transistor protective pattern that is formed over the reset transistor channel layer and between the reset transistor source electrode and the reset transistor drain electrode. The select transistor may further include a select transistor protective pattern that is formed over the select transistor channel layer and between the select transistor source electrode and the select transistor drain electrode.

In accordance with an embodiment of the inventive concepts, an image sensor may include a photodiode formed in a substrate, a lower interlayer dielectric layer formed over the substrate, a reset transistor gate electrode, a drive transistor gate electrode, and a select transistor gate electrode which are formed over the lower interlayer dielectric layer, a reset transistor gate insulation layer, a drive transistor gate insulation layer, and a select transistor gate insulation layer that are formed over the lower interlayer dielectric layer and conformally cover upper surfaces and sidewalls of the reset transistor gate electrode, the drive transistor gate electrode, and the select transistor gate electrode, respectively, a reset transistor channel layer, a drive transistor channel layer, and a select transistor channel layer formed over the reset transistor gate insulation layer, the drive transistor gate insulation layer, and the select transistor gate insulation layer, respectively, a reset transistor source electrode and a reset transistor drain electrode which are formed over the reset transistor channel layer, a drive transistor source electrode and a drive transistor drain electrode which are formed over the drive transistor channel layer; a select transistor source electrode and a select transistor drain electrode which are formed over the select transistor channel layer, and a transfer transistor gate electrode including an upper portion and a lower portion. The upper portion of the transfer transistor gate electrode may be formed over the drive transistor gate electrode. The lower portion of the transfer transistor gate electrode may be formed in a pillar shape and vertically extends from the upper portion of the transfer transistor gate electrode through the drive transistor gate electrode and the lower interlayer dielectric layer into the substrate.

The image sensor may further include a transfer transistor gate insulation layer that surrounds the lower portion of the transfer transistor gate electrode, and a transfer transistor channel layer formed under the transfer transistor gate insulation layer. The transfer transistor channel layer may directly contact a sidewall of the drive transistor gate electrode.

The drive transistor gate electrode may include a stack of a drive transistor main gate electrode and a drive transistor capping gate electrode. The drive transistor capping gate electrode and the transfer transistor channel layer may include the same material and be continuously connected to each other.

Each of the drive transistor gate electrode and the transfer transistor gate electrode may vertically overlap with the photodiode.

In accordance with an embodiment of the inventive concepts, an image sensor may include a lower interlayer dielectric layer formed over a substrate, a reset transistor main gate electrode and a drive transistor main gate electrode which are formed over the lower interlayer dielectric layer, a reset transistor capping gate electrode formed over the reset transistor main gate electrode, a drive transistor capping gate electrode formed over the drive transistor main gate electrode, a reset transistor gate insulation layer formed over the reset transistor capping gate electrode, a drive transistor gate insulation layer formed over the drive transistor capping gate electrode, a reset transistor channel layer formed over the reset transistor gate insulation layer, a drive transistor channel layer formed over the drive transistor gate insulation layer, a reset transistor source electrode and a reset transistor drain electrode which are formed over the reset transistor channel layer and spaced apart from each other, a drive transistor source electrode and a drive transistor drain electrode which are formed over the drive transistor channel layer and spaced apart from each other, a transfer transistor gate electrode including an upper portion and a lower portion, wherein the upper portion of the transfer transistor gate electrode is formed over the drive transistor capping gate electrode, wherein the lower portion of the transfer transistor gate electrode is formed in a pillar shape and vertically extends from the upper portion of the transfer transistor gate electrode through the drive transistor gate electrode and the lower interlayer dielectric layer into the substrate, a transfer transistor gate insulation layer that surrounds a lower portion of the transfer transistor gate electrode, and a transfer transistor channel layer formed under the transfer transistor gate insulation layer. The drive transistor capping gate electrode and the transfer transistor channel layer may include the same material and are continuously connected to each other.

An area in which the drive transistor main gate electrode overlaps the drive transistor drain electrode may be greater than an area in which the drive transistor main gate electrode overlaps the drive transistor source electrode.

Each of the transfer transistor gate electrode, the transfer transistor gate insulation layer, and the transfer transistor channel layer may vertically pass through the drive transistor main gate electrode and the lower interlayer dielectric layer.

Details of the embodiments of the inventive concepts are described in the detailed description of the present patent specification and the accompanying drawings.

BRIEF DESCRIPTION OF THE DRAWINGS

FIG. 4B is a conceptual layout of a unit pixel of an image sensor in accordance with an embodiment of the inventive concepts.

FIGS. 6A-6B, 7A-7B, 8A-8B, 9A-9B, 10A-10B, 11A-11B, 12A-12B, and FIGS. 13A-13B are longitudinal sectional views describing a method for fabricating an image sensor in accordance with an embodiment of the inventive concepts.

DETAILED DESCRIPTION

Figure 1:
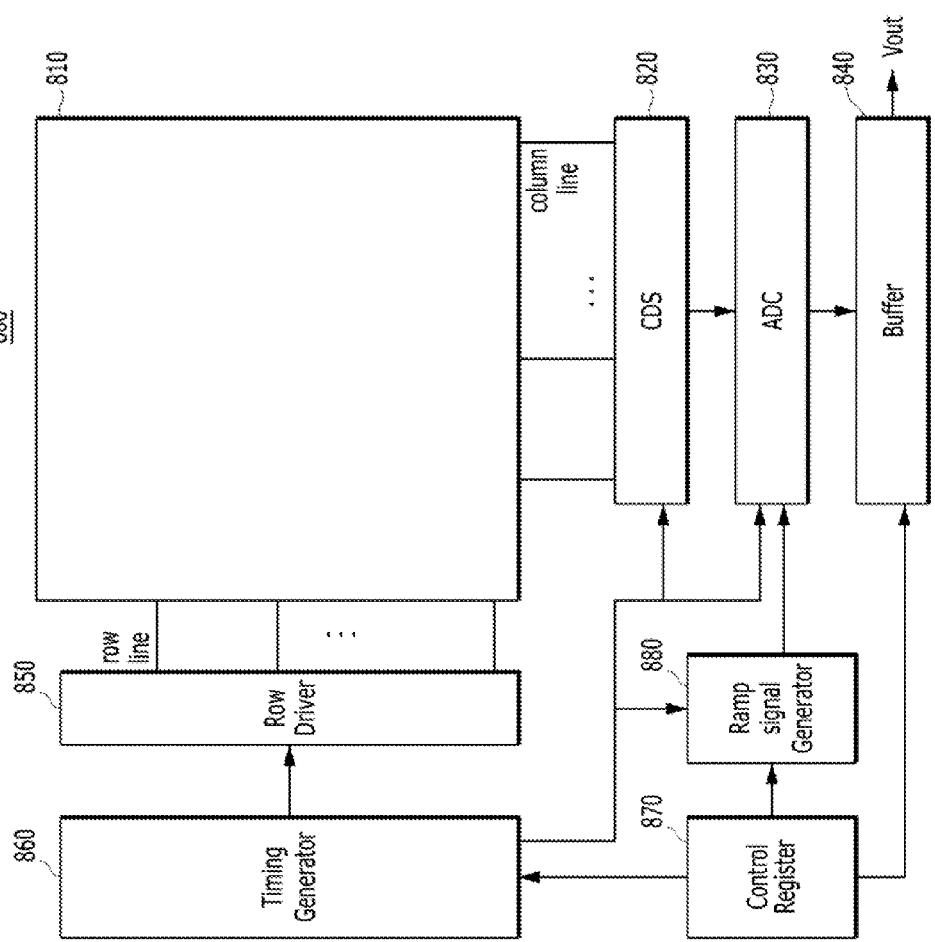
FIG. 1 is a block diagram illustrating an image sensor in accordance with an embodiment of the inventive concepts.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided to make this disclosure thorough and complete, and fully convey the scope of the inventive concepts to those skilled in the art. The spirit and scope of the invention are as defined in the claims.

The terms used in this patent specification are for describing the embodiments of the inventive concepts and they do not limit the scope of the inventive concepts. In this specification, the use of a singular term includes a plural term as well, unless mentioned otherwise. The use of an expression 'comprises' and/or 'comprising' a constituent element, step, and/or device in this patent specification does not exclude the presence or addition of another constituent element, step, and/or device.

When an element is described in this specification as 'connected to' or 'coupled to' another element, the description includes not only a direct connection or coupling but also an Indirect connection or coupling where yet another element is interposed between them. On the other hand, when an element is described as 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case in which the first layer is formed directly on the second layer or the substrate but also a case in which a third layer exists between the first layer and the second layer or the substrate.

The terms 'below', 'beneath', 'lower', 'above', and 'upper' are spatially relative words, and they may be used to describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the inventive concepts described in this specification are described with reference to the exemplary drawings which are cross-sectional views and/or plane views. The drawings are not necessarily to scale and in some instances, proportions may have been exaggerated to clearly illustrate features of the embodiments. Therefore, the forms of the exemplary drawings may be changed due to a fabrication method and/or tolerance. In this respect, the embodiments of the inventive concepts are not limited to the specific forms illustrated in the drawings, but include a variation in the shape formed according to the fabrication process. For example, a region illustrated to have a right angle may be a shape having a rounded portion or a predetermined curvature. Therefore, the regions shown in the drawings are roughly illustrated, and the shapes of the regions exemplarily illustrated in the drawings just show specific shapes of the regions of an element and they do not limit the scope of the inventive concepts.

Throughout the disclosure, like reference numerals refer to like parts throughout the various figures and embodiments of the inventive concepts. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

In this specification, a source electrode and a drain electrode of each transistor may be compatible. Since the transistors described in this patent specification are Field Effect Transistors (FET) such as Metal-Oxide-Semiconductor (MOS) transistors, the source electrode and the drain electrode are symmetric and compatible. Therefore, in diverse application embodiments of the inventive concepts, the source electrode may be construed to be a drain electrode, and the drain electrode may be construed to be a source electrode.

FIG. 1 is a block diagram illustrating an image sensor 800 in accordance with an embodiment of the inventive concepts. Referring to FIG. 1, the image sensor 800 in accordance with the embodiment of the inventive concepts may include a pixel array 810, a correlative double sampler (CDS) 820, an analog-to-digital converter (ADC) 830, a buffer 840, a row driver 850, a timing generator 860, a control register 870, and a ramp signal generator 880.

The pixel array 810 may include a plurality of pixels that are arrayed in a matrix structure. The pixels may convert optical image information into electrical image signals, and transfer the electrical image signals to the correlative double sampler 820 through column lines. Each of the pixels may be coupled to one row line and one column line.

The correlative double sampler 820 may hold and sample the electrical image signals transferred from the pixels of the pixel array 810. For example, the correlative double sampler 820 may sample the voltage level of the received electrical image signals with a reference voltage level according to a clock signal provided by the timing generator 860 and transfer analog signals corresponding to differences between the received electrical image signals and the reference voltage level to the analog-to-digital converter 830.

The analog-to-digital converter 830 may convert the received analog signals into digital signals and transfer the digital signals to the buffer 840.

The buffer 840 may receive the digital signals, latch the digital signals, and sequentially output them to an external image signal processor (not shown). The buffer 840 may include a memory for latching the digital signals, and a sense amplifier for amplifying the digital signals.

The row driver 850 may drive the pixels of the pixel array 810 according to a signal outputted from the timing generator 860. For example, the row driver 850 may generate driving signals to select one of row lines and drive the selected row line.

The timing generator 860 may generate a timing signal for controlling the correlative double sampler 820, the analog-to-digital converter 830, the row driver 850, and the ramp signal generator 880. The control register 870 may generate control signals for controlling the buffer 840, the timing generator 860, and the ramp signal generator 880.

The ramp signal generator 880 may generate a ramp signal for controlling image signals outputted from the buffer 840 under the control of the timing generator 860.

Figure 2A:
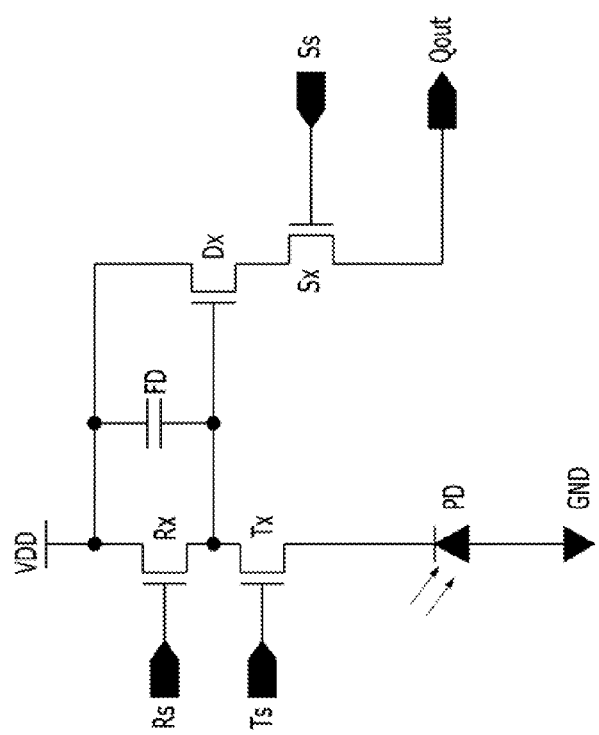
FIG. 2A is an equivalent circuit diagram of a unit pixel of an image sensor in accordance with an embodiment of the inventive concepts.
Figure 2B:
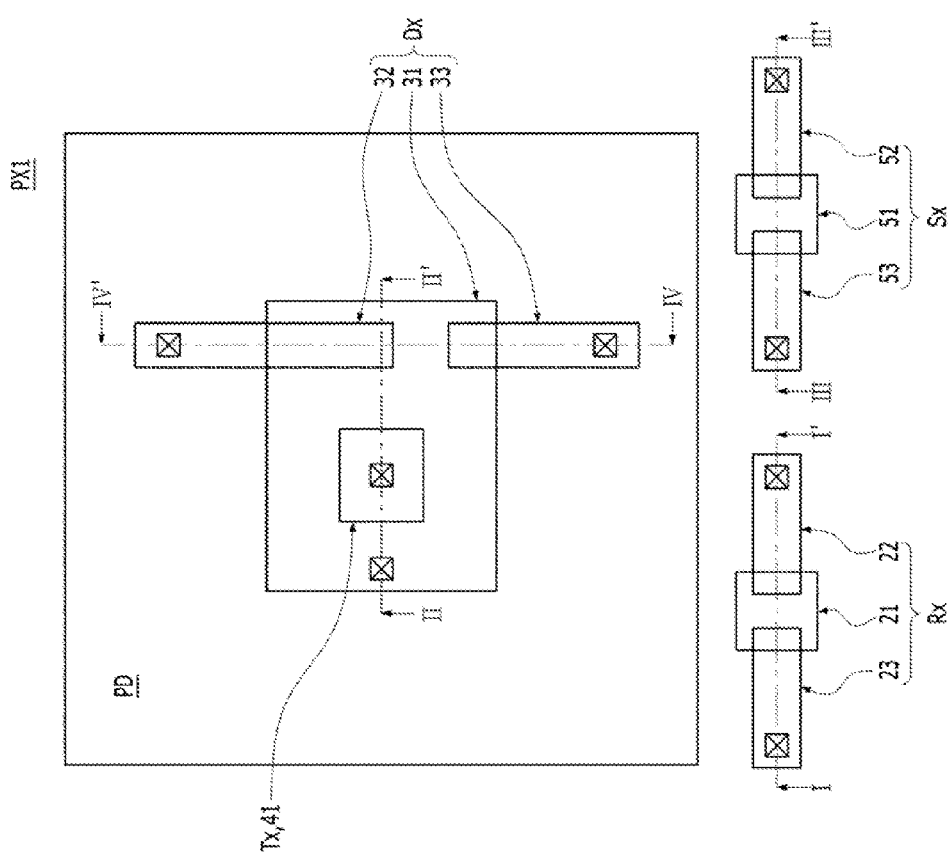
FIG. 2B is a conceptual layout of a unit pixel of an image sensor in accordance with an embodiment of the inventive concepts.

FIG. 2A is an equivalent circuit diagram of a unit pixel PX1 of an image sensor in accordance with an embodiment of the inventive concepts. FIG. 2B is a conceptual layout of the unit pixel PX1 shown in FIG. 2A.

Referring to FIG. 2A, the unit pixel PX1 of the image sensor in accordance with the embodiment of the inventive concepts may include a photodiode PD, a transfer transistor Tx, a reset transistor Rx, a drive transistor Dx, and a select transistor Sx. The unit pixel PX1 may further include a floating diffusion FD that is coupled to a source electrode and a drain electrode of the reset transistor Rx. The floating diffusion FD may function as a capacitor.

The photodiode PD may have an anode that is grounded and a cathode coupled to a source electrode of the transfer transistor Tx.

The transfer transistor Tx may include the source electrode that is electrically connected to the photodiode PD, and a drain electrode that is electrically connected to the source electrode of the reset transistor Rx, a drive transistor gate electrode of the drive transistor Dx, and a first electrode of the floating diffusion FD. The transfer transistor Tx may transfer charges that are generated in the photodiode PD based on a transfer signal Ts, which is inputted to a gate electrode of the transfer transistor Tx, to the source electrode of the reset transistor Rx, the gate electrode of the drive transistor Dx, and the first electrode of the floating diffusion FD. The source electrode of the reset transistor Rx, the gate electrode of the drive transistor Dx, and the first electrode of the floating diffusion FD may be connected to the same node. That is, the source electrode of the reset transistor Rx, the gate electrode of the drive transistor Dx, and the first electrode of the floating diffusion FD may be electrically directly connected to each other. Accordingly, the resistance among the source electrode of the reset transistor Rx, the gate electrode of the drive transistor Dx, and the first electrode of the floating diffusion FD is substantially 0 (zero) so that the power consumption of the image sensor may be reduced and the image sensor may perform rapid and speedy operations.

The reset transistor Rx may include the source electrode that is electrically connected to the drain electrode of the transfer transistor Tx, the gate electrode of the drive transistor Dx, and the first electrode of the floating diffusion FD, and the drain electrode that is electrically connected to a power source VDD. The reset transistor Rx may reset the source electrode of the reset transistor Rx, the gate electrode of the drive transistor Dx, and the first electrode of the floating diffusion FD to the same level as the power source VDD.

The drive transistor Dx may include the gate electrode that is electrically connected to the drain electrode of the transfer transistor Tx, the source electrode of the reset transistor Rx, and the first electrode of the floating diffusion FD, a drain electrode that is electrically connected to the power source VDD, and a source electrode that is electrically connected to a drain electrode of the select transistor Sx. The drive transistor Dx may transfer analog electrical signals from the power source VDD to the drain electrode of the select transistor Sx according to the amount of charges transferred by the transfer transistor Tx.

The select transistor Sx may output (Qout) the electrical signals that are transferred from the drive transistor Dx based on a selection signal Ss inputted to the gate electrode of the select transistor Sx. The floating diffusion FD may have a capacitor structure. Specifically, the floating diffusion FD may include the first electrode and the second electrode. The first electrode of the floating diffusion FD may be electrically connected to the drain electrode of the transfer transistor Tx, the gate electrode of the drive transistor Dx, and/or the source electrode of the reset transistor Rx. The second electrode may be electrically connected to the drain electrode of the drive transistor Dx and/or the power source VDD. The floating diffusion FD having the capacitor structure may effectively reduce dark current.

Referring to FIG. 2B, a unit pixel PX1 of an image sensor in accordance with an embodiment of the inventive concepts may include the photodiode PD, the transfer transistor Tx and the drive transistor Dx that are overlapped and vertically aligned with the photodiode PD, the reset transistor Rx, and the select transistor Sx. In some embodiments of the inventive concepts, the reset transistor Rx and the select transistor Sx may entirely or partially overlap the photodiode PD. Vias will be described later by referring to other drawings. The sizes of the elements of the unit pixel PX1 illustrated in FIG. 2B is simplified to help understand the technological concept of the inventive concepts. The elements and reference numerals that are not described yet will be described later by referring to FIGS. 3A and 3B.

Figure 3A:
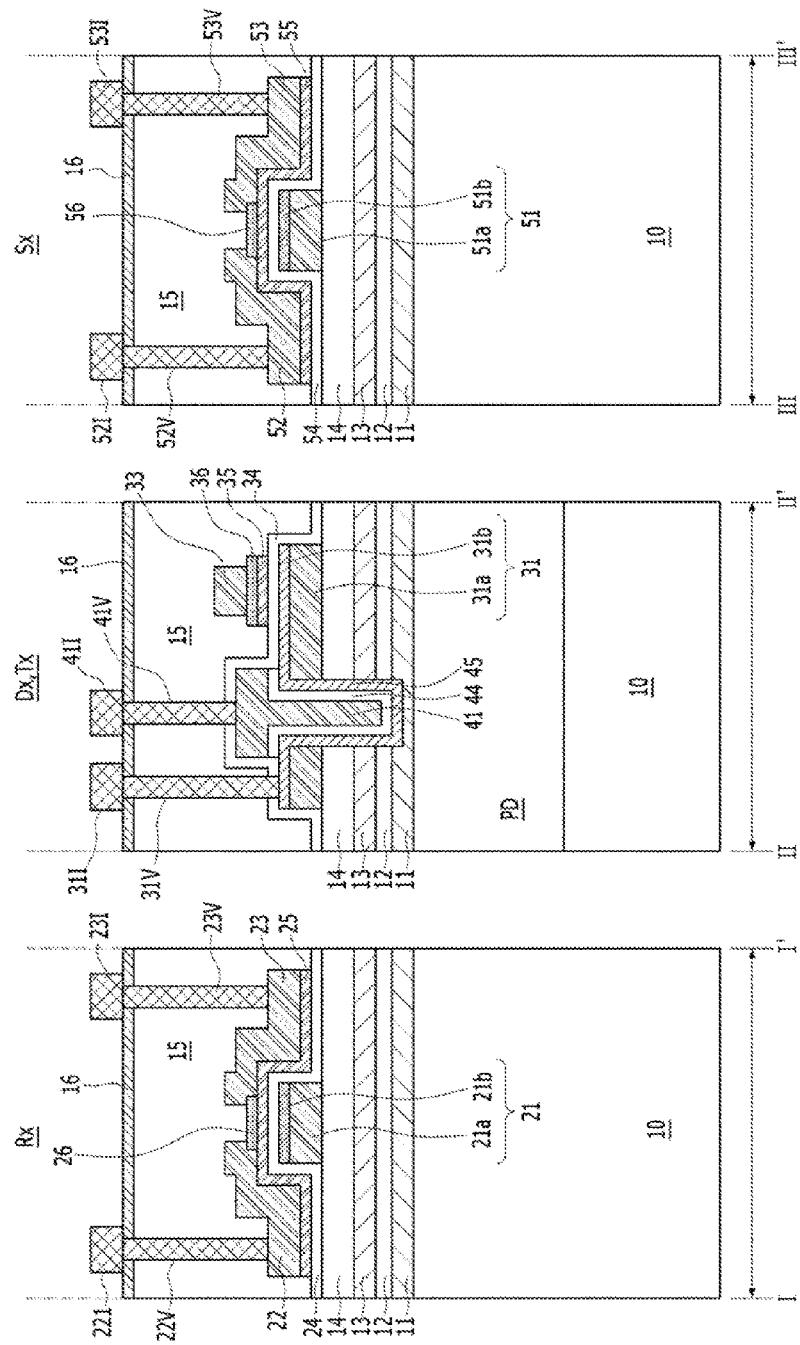
FIGS. 3A and 3B are longitudinal sectional views taken along the lines I-I', II-II', III-III' and IV-IV' in FIG. 2B.
Figure 3B:
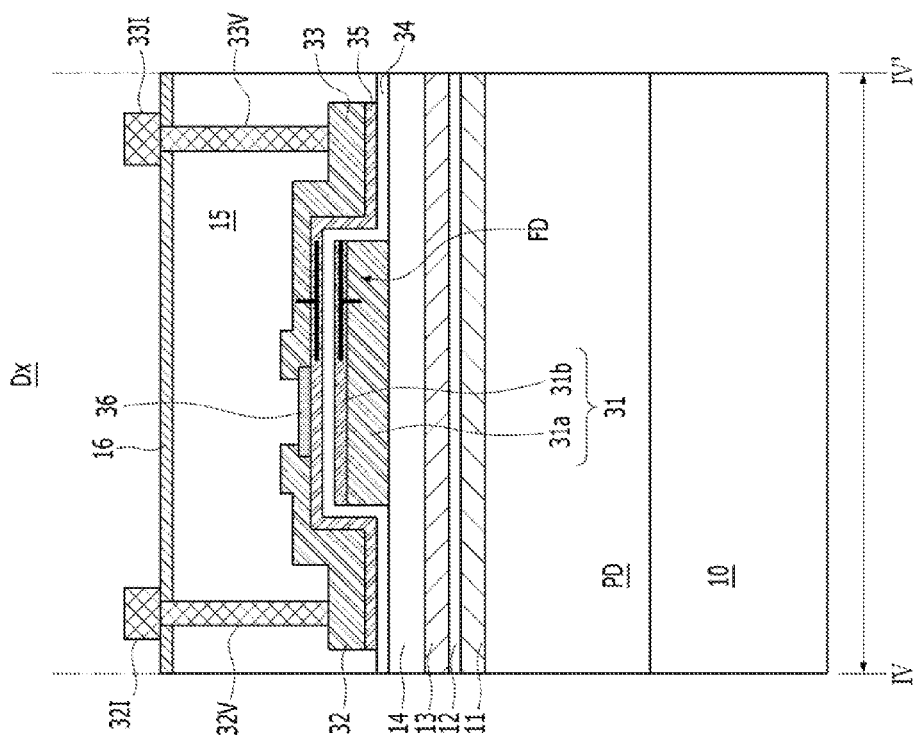

FIGS. 3A and 3B are longitudinal sectional views taken along the lines I-I', II-II', III-III' and IV-IV' in FIG. 2B.

Referring to FIGS. 3A and 3B, the unit pixel PX1 of the image sensor in accordance with the embodiment of the inventive concepts may include the photodiode PD in a substrate 10, the reset transistor Rx, the drive transistor Dx, the transfer transistor Tx, and the select transistor Sx that are disposed on the substrate 10. The unit pixel PX1 may further include a surface p-type region 11 in the inside of the substrate 10 adjacent to the surface of the substrate 10, and a buffer dielectric layer 12, a pad dielectric layer 13, and a lower Interlayer dielectric layer 14 that are formed directly on the surface p-type region 11.

The unit pixel PX1 may further include an upper interlayer dielectric layer 15 that covers the reset transistor Rx, the drive transistor Dx, the transfer transistor Tx, and the select transistor Sx, and a capping dielectric layer 16 that is formed on the upper interlayer dielectric layer 15. The unit pixel PX1 may further include vias 22V, 23V, 31V, 32V, 33V, 41V, 52V and 53V and interconnections 22I, 23I, 31I, 32I, 33I, 41I, 52I and 53I that vertically pass through the capping dielectric layer 16 and the upper interlayer dielectric layer 15 to be electrically connected to the electrodes of the reset transistor Rx, the drive transistor Dx, the transfer transistor Tx, and the select transistor Sx.

The transfer transistor Tx may have a Recessed Channel Array Transistor (RCAT) structure having a vertical channel. Each of the reset transistor Rx, the drive transistor Dx, and the select transistor Sx may have a reversed Thin Film Transistor (TFT) structure having a planar-type thin film channel Including lower gate electrodes and upper source/drain electrodes. That is, each of the pixel transistors such as the reset transistor Rx, the drive transistor Dx, and the select transistor Sx may have a thin film channel.

Since the four sides of the vertical channel of the transfer transistor Tx may be used as channels, the transfer transistor Tx may provide a wider channel width than a planar-type horizontal channel.

Since the pixel transistor such as the reset transistor Rx, the drive transistor Dx, and the select transistor Sx has a reversed thin film transistor structure, it may be formed on insulation regions, such as an isolation region. Accordingly, it does not have to use active regions to form the pixel transistors. Thus, most of the active regions may be used as photodiodes.

The substrate 10 may include a single crystalline silicon layer, a compound semiconductor layer, or an epitaxially grown silicon layer. The substrate 10 may include a p-type impurity such as boron (B). The photodiode PD may be a portion of the substrate 10 that includes an n-type impurity such as phosphorous (P) and arsenic (As). The surface p-type region 11 may be formed between the photodiode PD and the surface of the substrate 10. The surface p-type region 11 may be a portion of the substrate 10 including the p-type Impurity such as boron (B). The buffer dielectric layer 12, the pad dielectric layer 13, and the lower interlayer dielectric layer 14 may be sequentially stacked between the substrate 10 and the transistors Rx, Dx, Tx, and Sx. The buffer dielectric layer 12 and the lower interlayer dielectric layer 14 may include a silicon oxide, and the pad dielectric layer 13 may include a silicon nitride to have an etch selectivity to the buffer dielectric layer 12 and the lower interlayer dielectric layer 14.

The reset transistor Rx may include a reset transistor gate electrode 21 formed on the lower interlayer dielectric layer 14, a reset transistor gate insulation layer 24 covering the reset transistor gate electrode 21, a reset transistor channel layer 25 on the reset transistor gate insulation layer 24, and a reset transistor source electrode 22 and a reset transistor drain electrode 23 that are formed on the reset transistor channel layer 25. The reset transistor Rx may further include a reset transistor protective pattern 26 that is formed on the reset transistor channel layer 25 and partially overlaps each of the reset transistor source electrode 22 and the reset transistor drain electrode 23.

The reset transistor Rx may further include a reset transistor source via 22V that vertically passes through the capping dielectric layer 16 and the upper interlayer dielectric layer 15 to be coupled to the reset transistor source electrode 22, a reset transistor drain via 23V that vertically passes through the capping dielectric layer 16 and the upper interlayer dielectric layer 15 to be coupled to the reset transistor drain electrode 23, a reset transistor source interconnection 22I that is formed on the capping dielectric layer 16 and coupled to the reset transistor source via 22V, and a reset transistor drain interconnection 23I that is formed on the capping dielectric layer 16 and coupled to the reset transistor drain via 23V.

The reset transistor gate electrode 21 may include a reset transistor main gate electrode 21a and a reset transistor capping gate electrode 21b that is directly formed on the reset transistor main gate electrode 21a. The sides of the reset transistor main gate electrode 21a and the sides of the reset transistor capping gate electrode 21b may be vertically aligned with each other.

The reset transistor gate insulation layer 24 may be conformally formed to surround the upper and side surfaces of the reset transistor gate electrode 21. The reset transistor channel layer 25 may be conformally formed on the reset transistor gate insulation layer 24 to partially surround the upper and side surfaces of the reset transistor gate electrode 21.

The reset transistor source electrode 22 and the reset transistor drain electrode 23 may be conformally formed on the reset transistor channel layer 25 to partially surround the upper and side surfaces of the reset transistor gate electrode 21. The external side of the reset transistor source electrode 22 may be vertically aligned with a first side of the reset transistor channel layer 25, and a side of the reset transistor drain electrode 23 may be vertically aligned with a second side of the reset transistor channel layer 25. The reset transistor gate insulation layer 24 may extend further externally than the external sides of the reset transistor source electrode 22 and the reset transistor drain electrode 23 to cover the lower Interlayer dielectric layer 14.

The reset transistor protective pattern 26 may be formed on the reset transistor channel layer 25 between the reset transistor source electrode 22 and the reset transistor drain electrode 23 in such a manner that a portion of the reset transistor protective pattern 26 may be exposed. For example, both ends of the reset transistor protective pattern 26 may be partially covered with the reset transistor source electrode 22 and the reset transistor drain electrode 23. The reset transistor protective pattern 26 may have an etch selectivity with the reset transistor channel layer 25, the reset transistor source electrode 22, and the reset transistor drain electrode 23. Accordingly, the reset transistor protective pattern 26 may prevent the reset transistor channel layer 25 from being exposed between the reset transistor source electrode 22 and the reset transistor drain electrode 23.

According to the embodiment of the inventive concepts, the reset transistor Rx may have a reversed thin film transistor structure including a thin film channel. For example, the reset transistor channel layer 25 may be formed on the upper surface of the reset transistor gate electrode 21. Since the reset transistor channel layer 25 partially surrounds the sides of the reset transistor gate electrode 21, the channel width of the reset transistor Rx may be widened. Therefore, the reset transistor Rx may have reduced channel resistance and improved driving capability.

The drive transistor Dx may Include a drive transistor gate electrode 31 formed on the lower interlayer dielectric layer 14, a drive transistor gate insulation layer 34 covering the drive transistor gate electrode 31, a drive transistor channel layer 35 on the drive transistor gate insulation layer 34, and a drive transistor source electrode 32 and a drive transistor drain electrode 33 that are formed on the drive transistor channel layer 35. The drive transistor Dx may further include a drive transistor protective pattern 36 that is formed on the drive transistor channel layer 35 and partially overlaps each of the drive transistor source electrode 32 and the drive transistor drain electrode 33.

The drive transistor gate electrode 31 may include a drive transistor main gate electrode 31a and a drive transistor capping gate electrode 31b that is formed on the drive transistor main gate electrode 31a. The sides of the drive transistor main gate electrode 31a and the sides of the drive transistor capping gate electrode 31b may be vertically aligned with each other.

The drive transistor gate insulation layer 34 may be conformally formed to surround the upper and side surfaces of the drive transistor gate electrode 31. The drive transistor gate insulation layer 34 may conformally cover the upper and side surfaces of the transfer transistor Tx. The drive transistor channel layer 35 may be conformally formed on the drive transistor gate insulation layer 34 to partially surround the upper and side surfaces of the drive transistor gate electrode 31.

The drive transistor source electrode 32 and the drive transistor drain electrode 33 may be conformally formed on the drive transistor channel layer 35 to partially surround the upper and side surfaces of the drive transistor gate electrode 31. The external side of the drive transistor source electrode 32 may be vertically aligned with a first side of the drive transistor channel layer 35, and the external side of the drive transistor drain electrode 33 may be vertically aligned with a second side of the drive transistor channel layer 35. The drive transistor drain electrode 33 may overlap the drive transistor gate electrode 31. A width by which the drive transistor drain electrode 33 overlaps the drive transistor gate electrode 31 is greater than a width by which the drive transistor source electrode 32 overlaps the drive transistor gate electrode 31. For example, there may be an un-negligible amount of capacitance between the drive transistor gate electrode 31 and the drive transistor drain electrode 33. Therefore, a floating diffusion FD is formed to serve as a capacitor between the drive transistor gate electrode 31 and the drive transistor drain electrode 33.

The drive transistor protective pattern 36 may be formed on the drive transistor channel layer 35 between the drive transistor source electrode 32 and the drive transistor drain electrode 33 in such a manner that a portion of the drive transistor protective pattern 36 may be exposed. For example, both ends of the drive transistor protective pattern 36 may be partially covered with the drive transistor source electrode 32 and the drive transistor drain electrode 33. The drive transistor protective pattern 36 may have an etch selectivity with the drive transistor channel layer 35, the drive transistor source electrode 32 and the drive transistor drain electrode 33. Therefore, the drive transistor protective pattern 36 may prevent the drive transistor channel layer 35 from being exposed between the drive transistor source electrode 32 and the drive transistor drain electrode 33.

The drive transistor Dx may further include a drive transistor gate via 31V and a drive transistor gate interconnection 31I that vertically pass through the capping dielectric layer 16 and the upper interlayer dielectric layer 15 to be coupled to the drive transistor gate electrode 31, a drive transistor source via 32V and a drive transistor source interconnection 32I that are coupled to the drive transistor source electrode 32, and a drive transistor drain via 33V and a drive transistor drain interconnection 33I that are coupled to the drive transistor drain electrode 33. The drive transistor gate via 31V may further pass through the drive transistor gate insulation layer 34.

According to the embodiment of the inventive concepts, the drive transistor Dx may have a reversed thin film transistor structure including a thin film channel. For example, the drive transistor channel layer 35 may be formed on the drive transistor gate electrode 31. Since the drive transistor channel layer 35 partially surrounds the sides of the drive transistor gate electrode 31, the channel width of the drive transistor Dx may be widened. Therefore, the drive transistor Dx may have reduced channel resistance and improved driving capability.

The transfer transistor Tx may include a transfer transistor gate electrode 41 of a pillar shape that vertically passes through the drive transistor gate electrode 31, the lower interlayer dielectric layer 14, the pad dielectric layer 13 and the buffer dielectric layer 12 and protrudes into the inside of the substrate 10. Specifically, the transfer transistor gate electrode 41 may have a longitudinal cross-section of a 'T' shape or a stud shape. The transfer transistor Tx may use the photodiode PD and the surface p-type region 11 as a source electrode, and use the drive transistor gate electrode 31 as a drain electrode.

The transfer transistor Tx may include the transfer transistor gate insulation layer 44 that is conformally formed to surround the sides and lower surface of the transfer transistor gate electrode 41. The transfer transistor Tx may include a transfer transistor channel layer 45 that is conformally formed on the transfer transistor gate insulation layer 44 to surround the sides and lower surface of the transfer transistor gate electrode 41.

The transfer transistor channel layer 45 may be formed to integrate with the drive transistor capping gate electrode 31b of the drive transistor gate electrode 31 by including the same material as that of the drive transistor capping gate electrode 31b so that the transfer transistor channel layer 45 and the drive transistor capping gate electrode 31b may be continuously connected to each other. The transfer transistor channel layer 45 may be electrically connected to one side of the drive transistor main gate electrode 31a by directly contacting the side of the drive transistor main gate electrode 31a.

The transfer transistor gate insulation layer 44 may include the same material as that of the drive transistor gate insulation layer 34. The drive transistor gate insulation layer 34 may conformally cover the upper surface and sides of the transfer transistor gate electrode 41.

Since the transfer transistor Tx has a vertical channel, the occupying area of the transfer transistor Tx may be decreased compared with a transfer transistor having a horizontal channel in a top view. Therefore, the occupying area of the photodiode PD may be maximized, and the driving rate of the drive transistor Dx may be faster while the capacitance of the floating diffusion FD may be increased.

The transfer transistor Tx may further include a transfer transistor gate via 41V that vertically passes through the capping dielectric layer 16 and the upper interlayer dielectric layer 15 to be coupled to the transfer transistor gate electrode 41, and a transfer transistor gate interconnection 41I on the transfer transistor gate via 41V. The transfer transistor gate via 41V may further pass through the drive transistor gate insulation layer 34.

The select transistor Sx may include a select transistor gate electrode 51 formed on the lower interlayer dielectric layer 14, a select transistor gate insulation layer 54 covering the select transistor gate electrode 51, a select transistor channel layer 55 on the select transistor gate insulation layer 54, and a select transistor source electrode 52 and a select transistor drain electrode 53 that are formed on the select transistor channel layer 55. The select transistor Sx may further include a select transistor protective pattern 56 that is formed on the select transistor channel layer 55 and partially overlaps with each of the select transistor source electrode 52 and the select transistor drain electrode 53.

The select transistor Sx may further include a select transistor source via 52V, a select transistor drain via 53V, a select transistor source interconnection 52I, and a select transistor drain interconnection 53I. The select transistor source via 52 may vertically pass through the capping dielectric layer 16 and the upper interlayer dielectric layer 15 to be coupled to the select transistor source electrode 52. The select transistor drain via may vertically pass through the capping dielectric layer 16 and the upper interlayer dielectric layer 15 to be coupled to the select transistor drain electrode 53. The select transistor source interconnection 52I may be formed on the capping dielectric layer 16 and coupled to the select transistor source via 52V. The select transistor drain interconnection 53I may be formed on the capping dielectric layer 16 and coupled to the select transistor drain via 53V.

The select transistor gate electrode 51 may include a select transistor main gate electrode 51a and a select transistor capping gate electrode 51b that is directly formed on the select transistor main gate electrode 51a. The sides of the select transistor main gate electrode 51a and the sides of the select transistor capping gate electrode 51b may be vertically aligned with each other.

The select transistor gate insulation layer 54 may be conformally formed to surround the upper and side surfaces of the select transistor gate electrode 51. The select transistor channel layer 55 may be conformally formed on the select transistor gate insulation layer 54 to partially surround the upper and side surfaces of the select transistor gate electrode 51.

The select transistor source electrode 52 and the select transistor drain electrode 53 may be conformally formed on the select transistor channel layer 55 to partially surround the upper and side surfaces of the select transistor gate electrode 51. The external side of the select transistor source electrode 52 may be vertically aligned with a first side of the select transistor channel layer 55, and the external side of the select transistor drain electrode 53 may be vertically aligned with a second side of the select transistor channel layer 55.

The select transistor protective pattern 56 may be formed on the select transistor channel layer 55 between the select transistor source electrode 52 and the select transistor drain electrode 53 in such a manner that a portion of the select transistor protective pattern 56 may be exposed. For example, both ends of the select transistor protective pattern 56 may be partially covered with the select transistor source electrode 52 and the select transistor drain electrode 53. The select transistor protective pattern 56 may have an etch selectivity to the select transistor channel layer 55, the select transistor source electrode 52 and the select transistor drain electrode 53. Therefore, the select transistor protective pattern 56 may prevent the select transistor channel layer 55 from being exposed between the select transistor source electrode 52 and the select transistor drain electrode 53.

According to the embodiment of the inventive concepts, the select transistor Sx may have a reversed thin film transistor structure including a thin film channel. For example, the select transistor channel layer 55 may be formed on the select transistor gate electrode 51. Since the select transistor channel layer 55 partially surrounds the sides of the select transistor gate electrode 51, the channel width of the select transistor Sx may be widened. Therefore, the select transistor Sx may have reduced channel resistance and improved driving capability.

All the main gate electrodes 21*a*, 31*a* and 51*a* and the transfer transistor gate electrode 41 may include a conductor such as a doped polysilicon or metal. All the capping gate electrodes 21*b*, 31*b* and 51*b* may Include re-crystallized doped polysilicon. All the main gate electrodes 21*a*, 31*a* and 51*a*, the transfer transistor gate electrode 41, and all the capping gate electrodes 21*b*, 31*b* and 51*b* may include an N-type Impurity.

The reset transistor gate insulation layer 24, the drive transistor gate insulation layer 34, the transfer transistor gate insulation layer 44, and the select transistor gate insulation layer 54 may include a silicon oxide or a metal oxide.

The reset transistor channel layer 25, the drive transistor channel layer 35, the transfer transistor channel layer 45, and the select transistor channel layer 55 may include polysilicon. For example, the reset transistor channel layer 25, the drive transistor channel layer 35, the transfer transistor channel layer 45, and the select transistor channel layer 55 may include a re-crystallized doped polysilicon including an n-type impurity.

The reset transistor gate electrode 21, the reset transistor source electrode 22, the reset transistor drain electrode 23, the drive transistor gate electrode 31, the drive transistor source electrode 32, the drive transistor drain electrode 33, the transfer transistor gate electrode 41, the select transistor gate electrode 51, the select transistor source electrode 52, and the select transistor drain electrode 53 may include a conductor such as a doped polysilicon or metal.

The reset transistor protective pattern 26, the drive transistor protective pattern 36 and the select transistor protective pattern 56 may include a silicon nitride.

All the vias 22V, 23V, 31V, 32V, 33V, 41V, 52V and 53V may vertically transfer electrical signals. All of the interconnections 22I, 23I, 31I, 32I, 33I, 41I, 52I and 53I may include a conductor such as metal or a doped polysilicon.

The reset transistor gate electrode 21, the drive transistor gate electrode 31, and the select transistor gate electrode 51 may be disposed at the same level. Furthermore, the reset transistor main gate electrode 21*a*, the drive transistor main gate electrode 31*a*, and the select transistor main gate electrode 51*a* may be disposed at the same level and have the same thickness as each other. Also, the reset transistor capping gate electrode 21*b*, the drive transistor capping gate electrode 31*b* and the select transistor capping gate electrode 51*b* may be disposed at the same level and have the same thickness as each other.

Figure 4A:
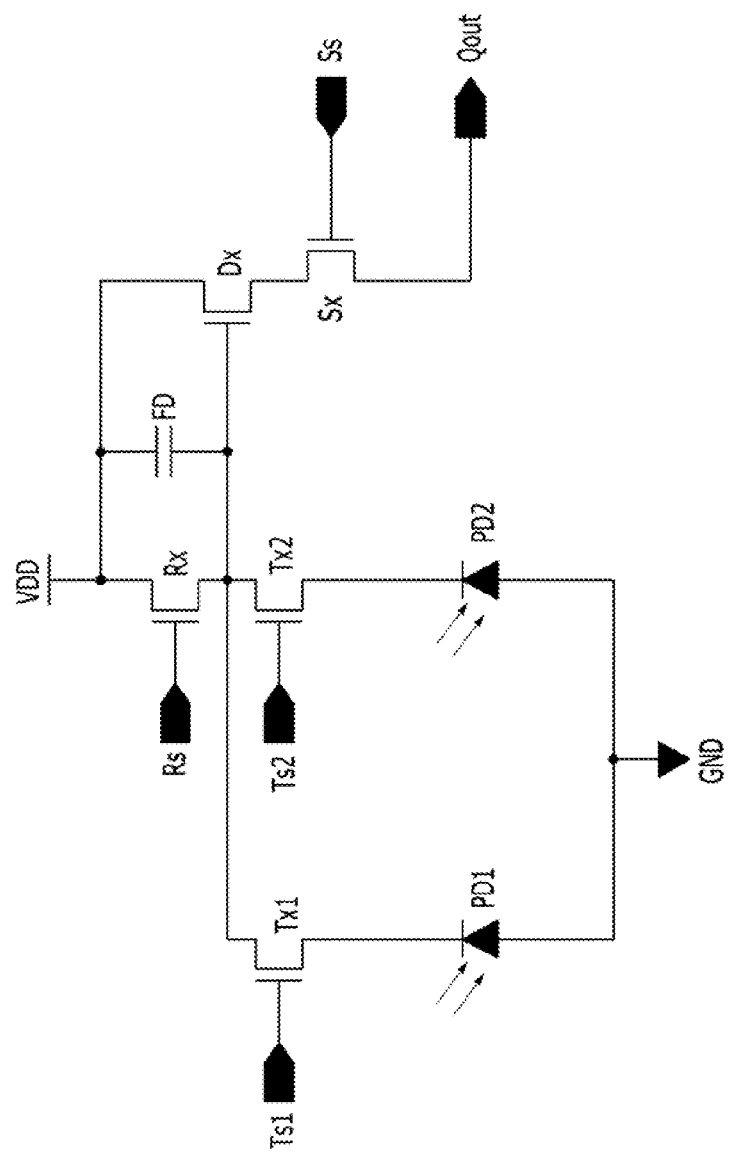
FIG. 4A is an equivalent circuit diagram of a unit pixel of an image sensor in accordance with an embodiment of the inventive concepts.

FIG. 4A is an equivalent circuit diagram of a unit pixel PX2 of an image sensor in accordance with an embodiment of the inventive concepts. FIG. 4B is a conceptual layout of the unit pixel PX2 of the image sensor 800 in accordance with the embodiment of the inventive concepts.

Referring to FIG. 4A, the unit pixel PX2 of the image sensor 800 in accordance with the embodiment of the inventive concepts may include a first photodiode PD1 and a second photodiode PD2 and a first transfer transistor Tx1 and a second transfer transistor Tx2 that are coupled in parallel to each other. Compare with the unit pixel PX1 Illustrated in FIG. 2A. For example, the two photodiodes PD1 and PD2 and the two transfer transistors Tx1 and Tx2 may share one pixel circuit. The two transfer transistors Tx1 and Tx2 may Independently operate from each other in response to a first transfer signal Ts1 and a second transfer signal Ts2, respectively. The pixel circuit may include a reset transistor Rx, a drive transistor Dx, a floating diffusion FD, and a select transistor Sx.

Referring to FIG. 4B, the two photodiodes PD1 and PD2 and the two transfer transistors Tx1 and Tx2 may be disposed on both sides of one drive transistor Dx in the unit pixel PX2 of the image sensor 800 in accordance with the embodiment of the inventive concepts. The two photodiodes PD1 and PD2 and the two transfer transistors Tx1 and Tx2 may share one drive transistor Dx. An isolation region ISO may be formed between the first photodiode PD1 and the second photodiode PD2.

Figure 5:
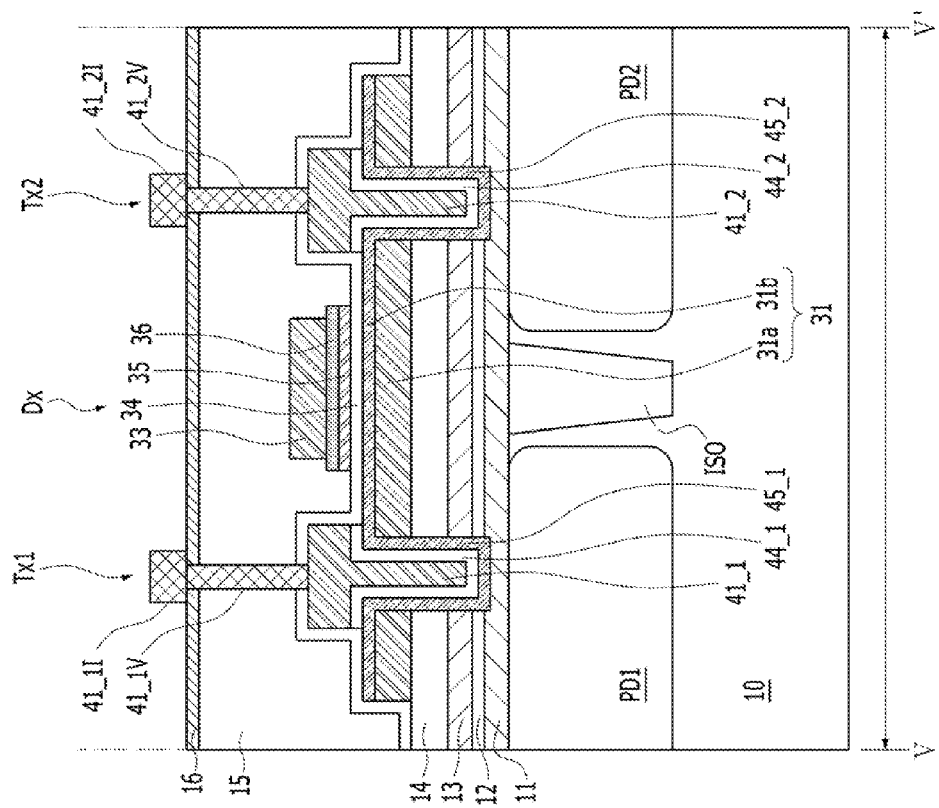
FIG. 5 is a longitudinal sectional view taken along the line V-V' in FIG. 4B.

FIG. 5 is a longitudinal section obtained by cutting the unit pixel PX2 of the image sensor 800 of FIG. 4B along the line V-V' of FIG. 4B. Referring to FIG. 5, the unit pixel PX2 of the image sensor 800 in accordance with the embodiment of the inventive concepts may include the first photodiode PD1 and the second photodiode PD2 inside the substrate 10, the first transfer transistor Tx1 and the second transfer transistor Tx2 on the substrate 10, and one shared drive transistor Dx.

The first transfer transistor Tx1 may include a first transfer transistor gate electrode 41_1 having a pillar shape that vertically passes through the drive transistor gate electrode 31, the lower interlayer dielectric layer 14, the pad dielectric layer 13, and the buffer dielectric layer 12 and protrudes into the inside of the substrate 10. The first transfer transistor Tx1 may include a first transfer transistor gate insulation layer 44_1 that conformally surrounds the sides and lower surface of the first transfer transistor gate electrode 41_1. Also, the first transfer transistor Tx1 may include a first transfer transistor channel layer 45_1 that is conformally formed on the first transfer transistor gate insulation layer 44_1 to conformally surround the sides and lower surface of the first transfer transistor gate electrode 41_1.

The second transfer transistor Tx2 may include a second transfer transistor gate electrode 41_2 having a pillar shape that vertically passes through the drive transistor gate electrode 31, the lower interlayer dielectric layer 14, the pad dielectric layer 13, and the buffer dielectric layer 12 and protrudes into the inside of the substrate 10. The second transfer transistor Tx2 may include a second transfer transistor gate insulation layer 44_2 that conformally surrounds the sides and lower surface of the second transfer transistor gate electrode 41_2. Also, the second transfer transistor Tx2 may include a second transfer transistor channel layer 45_2 that is conformally formed on the second transfer transistor gate insulation layer 44_2 to conformally surround the sides and lower surface of the second transfer transistor gate electrode 41_2.

The first transfer transistor channel layer 45_1 and the second transfer transistor channel layer 45_2 may be formed to integrate with the drive transistor gate electrode 31 by including the same material as that of the drive transistor gate electrode 31 so that the first and second transfer transistor channel layers 45_1 and 45_2 and the drive transistor gate electrode 31 may form a physical continuum. The first transfer transistor gate insulation layer 44_1 and the second transfer transistor channel layer 45_2 may include the same material as that of the drive transistor gate insulation layer 34.

The first photodiode PD1 and the second photodiode PD2 may be electrically isolated by an isolation region ISO. The first transfer transistor Tx1 and the second transfer transistor Tx2 may use the first photodiode PD1 and the second photodiode PD2 as source electrodes, respectively. The first transfer transistor Tx1 and the second transfer transistor Tx2 may use one drive transistor gate electrode 31 as a common drain electrode.

FIGS. 6A-13B are longitudinal sections describing a method for fabricating an image sensor in accordance with an embodiment of the inventive concepts. FIGS. 6A, 7A, 8A, 9A, 10A, 11A, 12A and 13A are longitudinal sections obtained by cutting the image sensor along the lines I-I', II-II' and III-III' shown in FIG. 2B in accordance with the embodiment of the inventive concepts. FIGS. 6B, 7B, 8B, 9B, 10B, 11B, 12B and 13B are longitudinal sections obtained by cutting the image sensor along the line IV-IV' shown in FIG. 2B in accordance with the embodiment of the inventive concepts.

Figure 6A:
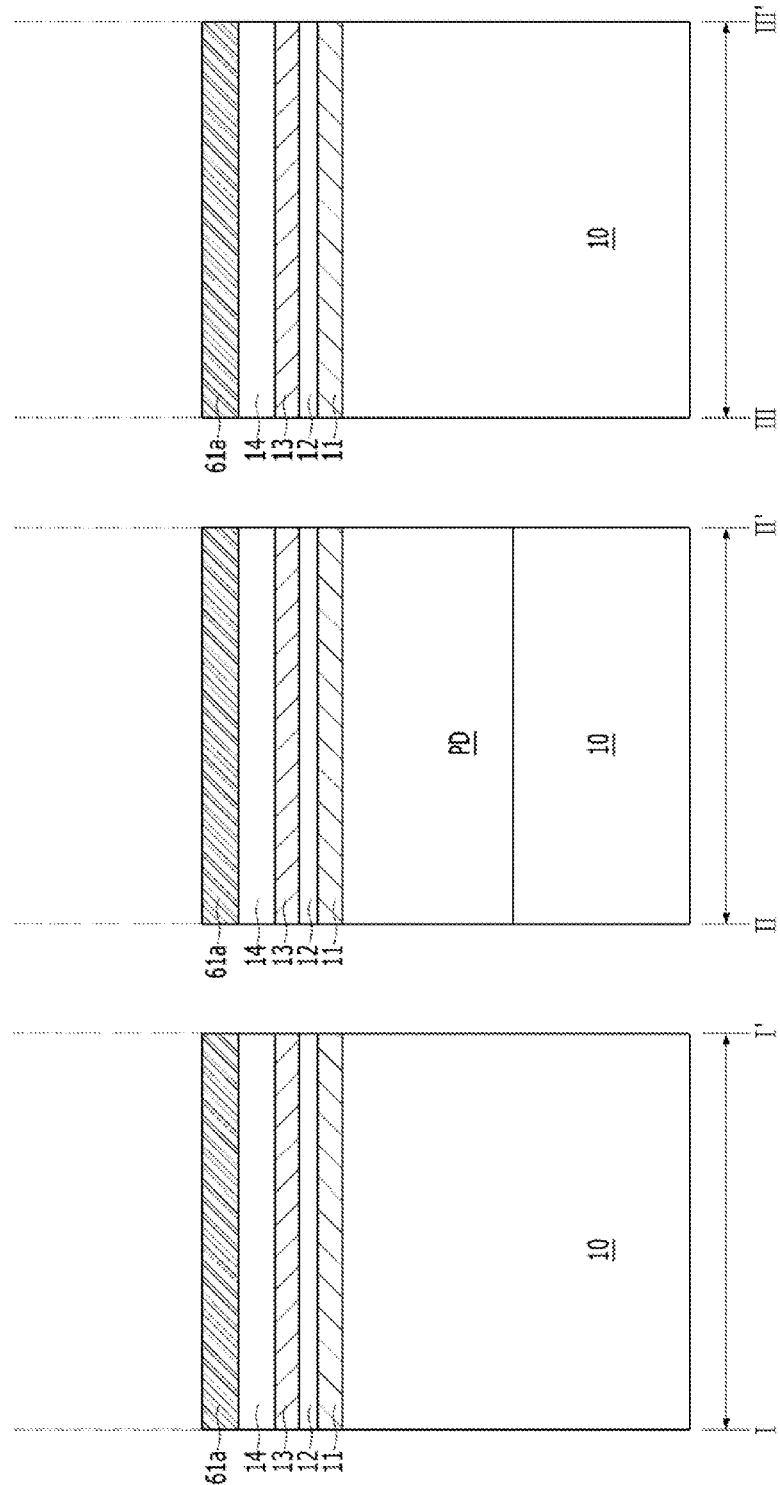
Figure 6B:
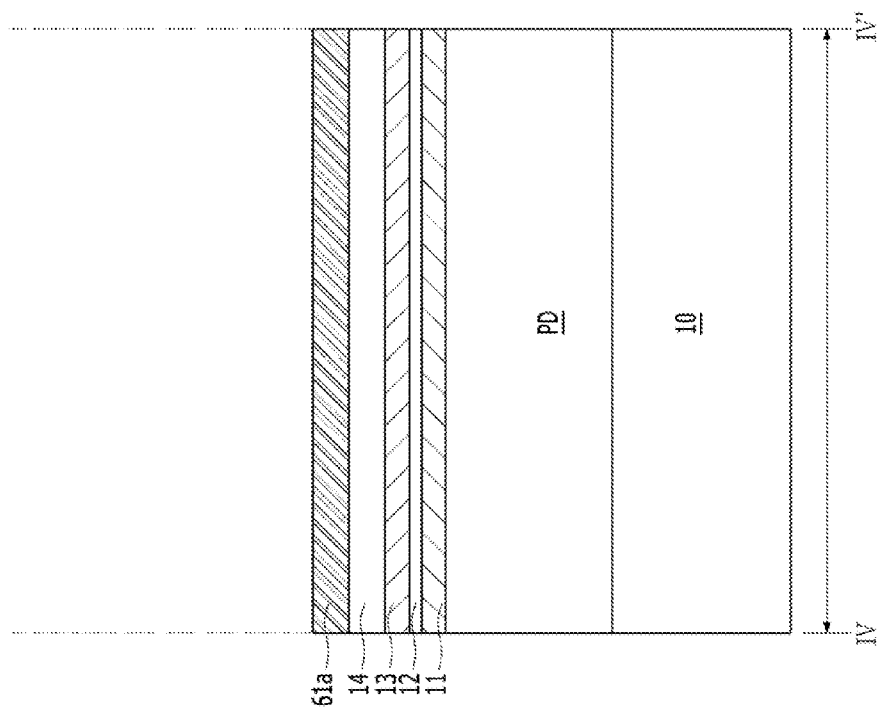

Referring to FIGS. 6A and 6B, the method for fabricating the image sensor in accordance with the embodiment of the inventive concepts may include forming a photodiode PD and a surface p-type region 11 in a substrate 10, and forming a buffer dielectric layer 12, a pad dielectric layer 13, a lower interlayer dielectric layer 14, and a first electrode layer 61a on the substrate 10. The substrate 10 may be a single crystalline silicon substrate or an epitaxially grown silicon layer. The photodiode PD may be formed by implanting an n-type impurity such as phosphorous (P) or arsenic (As) into a bulk region of the substrate 10 through an ion implantation process and a diffusion process, or an ion diffusion process. The surface p-type region 11 may be formed by implanting a p-type impurity such as boron (B) into a surface region of the substrate 10 through an ion Implantation process or an ion diffusion process.

The buffer dielectric layer 12 may be formed by directly forming a silicon oxide layer on the surface of the substrate 10 by performing a deposition process, a coating process, or an oxidation process. The pad dielectric layer 13 may be formed by depositing a silicon nitride on the buffer dielectric layer 12. The lower interlayer dielectric layer 14 may be formed by forming a silicon oxide layer on the pad dielectric layer 13 through a deposition process or a coating process. The first electrode layer 61a may be formed by depositing a doped polysilicon layer on the lower interlayer dielectric layer 14 through a Chemical Vapor Deposition (CVD) process. According to another embodiment of the inventive concepts, the first electrode layer 61a may include a silicide or metal. For example, the first electrode layer 61a may be formed through a silicidation process or a metal deposition process.

Figure 7A:
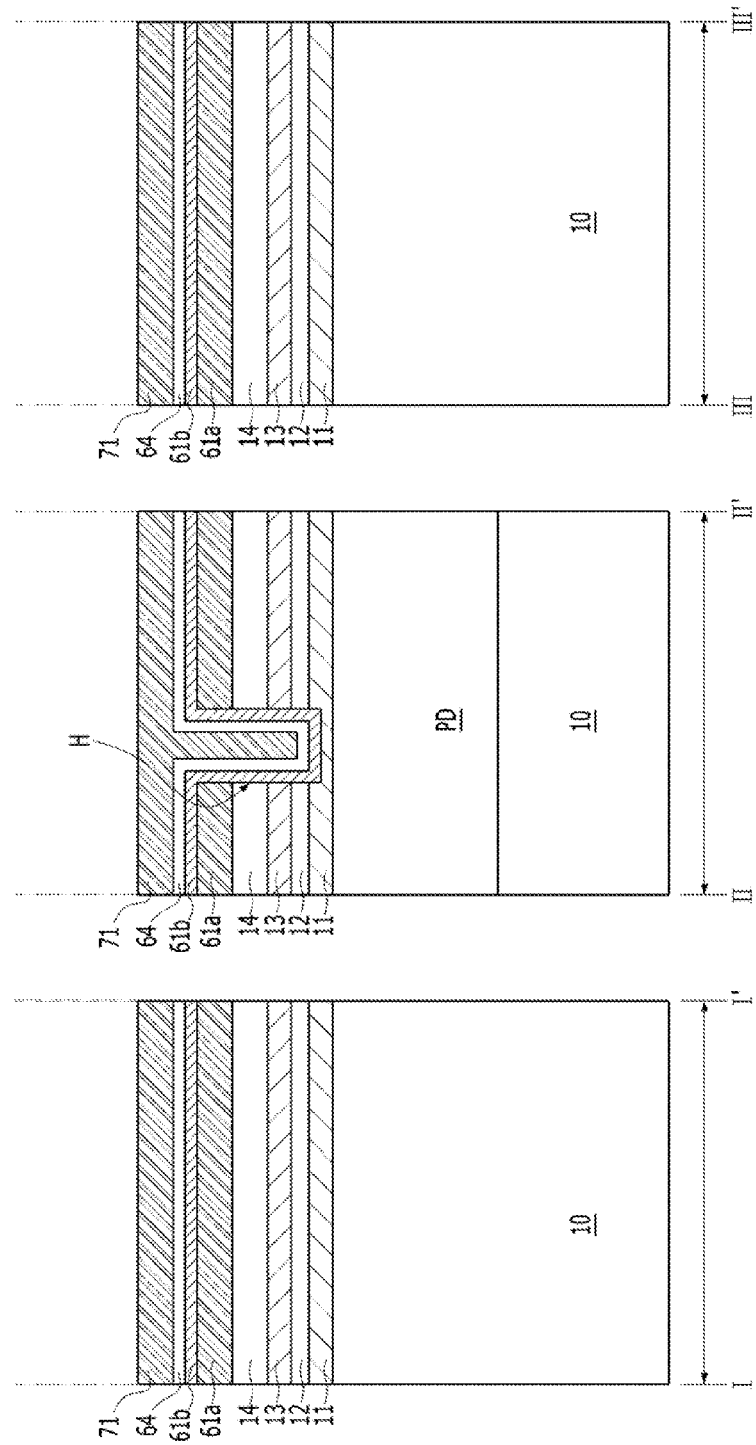
Figure 7B:
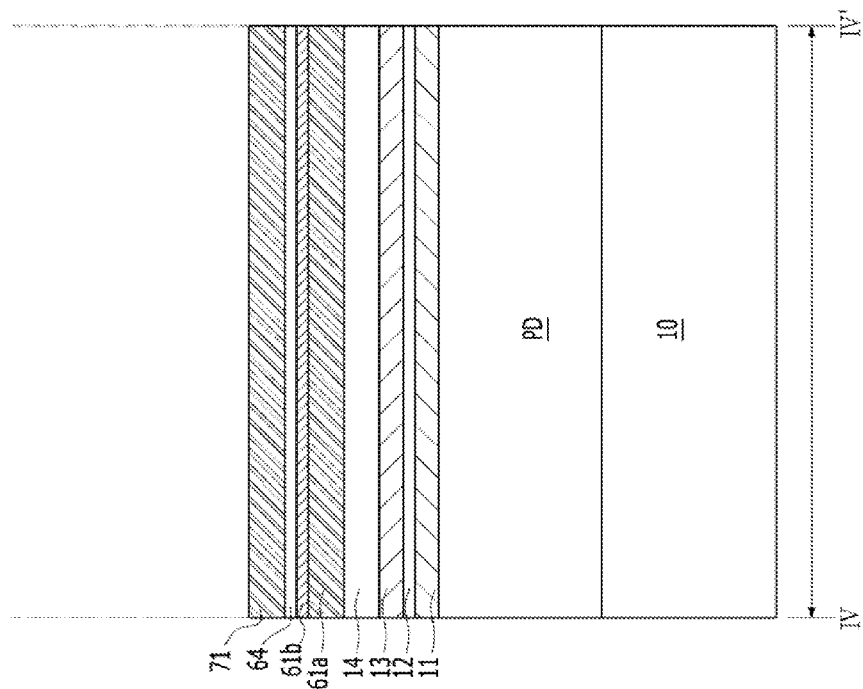

Referring to FIGS. 7A and 7B, the method for fabricating the image sensor in accordance with the embodiment of the inventive concepts may include performing an etch process to pass through the first electrode layer 61a, the lower interlayer dielectric layer 14, the pad dielectric layer 13, and the buffer dielectric layer 12, forming a hole H which extends into the inside of the substrate 10, conformally forming a second electrode layer 61b and a first gate dielectric layer 64 on the bottom and internal walls of the hole H, which are the upper surface of the first electrode layer 61a, forming a third electrode layer 71 on the first gate dielectric layer 64 to fill the inside of the hole H.

For example, the bottom of the hole H may be disposed in the inside of the surface p-type region 11. The second electrode layer 61b may be formed by conformally depositing a polysilicon layer on the bottom and internal walls of the hole H and the upper surface of the first electrode layer 61a through a chemical vapor deposition process and performing a re-crystallization process. Therefore, the second electrode layer 61b may include a doped polysilicon including an n-type impurity, silicides, metals, metal alloys, metal compounds, or a combination thereof.

The first gate dielectric layer 64 may be formed by conformally forming a silicon oxide layer or a metal oxide layer on the second electrode layer 61b through a deposition process such as a chemical vapor deposition process. According to another embodiment of the inventive concepts, the first gate dielectric layer 64 may be formed by performing an oxidation process and oxidizing the surface of the second electrode layer 61b. The second electrode layer 61b may provide a depletion-mode transistor channel by including an n-type impurity or it may provide an enhancement-type transistor channel by Including a p-type impurity.

Figure 8A:
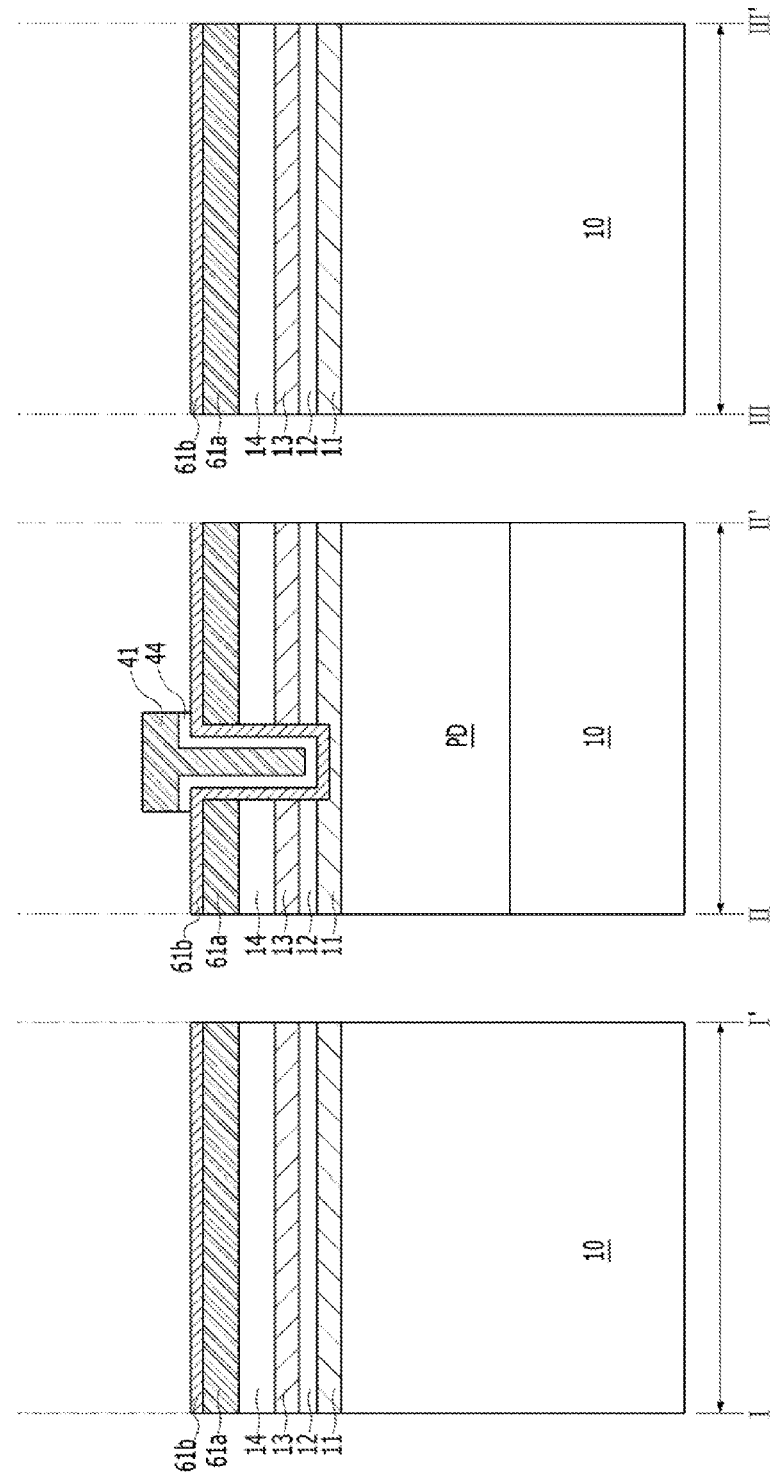

Referring to FIGS. 8A and 8B, the method for fabricating the image sensor in accordance with the embodiment of the inventive concepts may include forming a transfer transistor gate electrode 41 and a transfer transistor gate insulation layer 44. The transfer transistor gate electrode 41 may be formed by performing an etch process and patterning the third electrode layer 71. The transfer transistor gate insulation layer 44 may be formed by etching the first gate dielectric layer 64 while etching the third electrode layer 71. As a result, the sidewalls of the transfer transistor gate insulation layer 44 and the sidewalls of the transfer transistor gate electrode 41 may be vertically aligned with each other. The transfer transistor gate Insulation layer 44 may be patterned by over-etching the transfer transistor gate electrode 41 or by performing an individual etch process. The first electrode layer 61a and the second electrode layer 61b may be exposed.

Figure 9A:
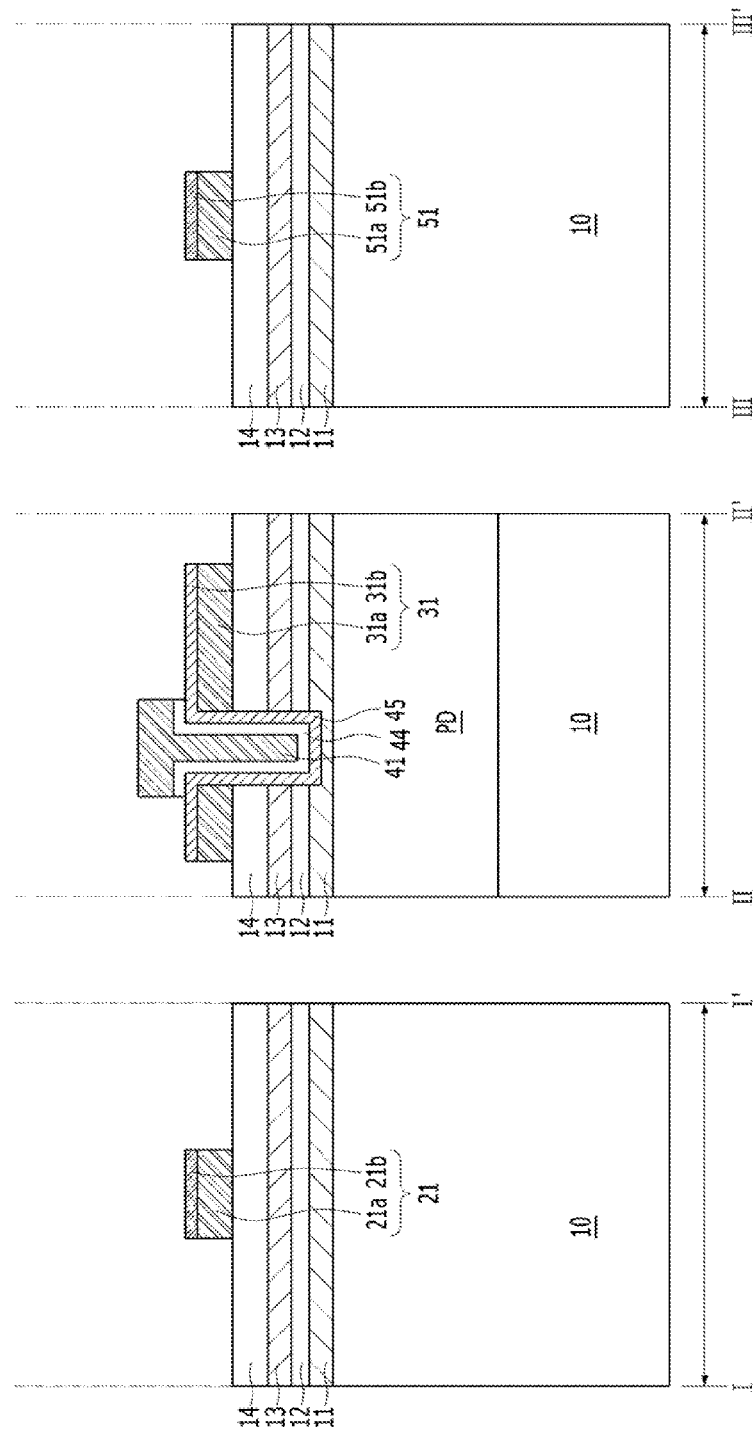

Referring to FIGS. 9A and 9B, the method for fabricating the image sensor in accordance with the embodiment of the inventive concepts may include forming a reset transistor gate electrode 21, a drive transistor gate electrode 31, and a select transistor gate electrode 51 by performing an etch process for patterning the second electrode layer 61b and the first electrode layer 61a. The reset transistor gate electrode 21, the drive transistor gate electrode 31 and the select transistor gate electrode 51 may include a reset transistor main gate electrode 21a, a drive transistor main gate electrode 31a, and a select transistor main gate electrode 51a. The second electrode layer 61b and a reset transistor capping gate electrode 21b, a drive transistor capping gate electrode 31b and a select transistor capping gate electrode 51b that are patterned with the first electrode layer 61a, respectively. Through the process, a transfer transistor Tx including the transfer transistor gate electrode 41, the transfer transistor gate insulation layer 44, and a transfer transistor channel layer 45 may be formed.

Figure 10A:
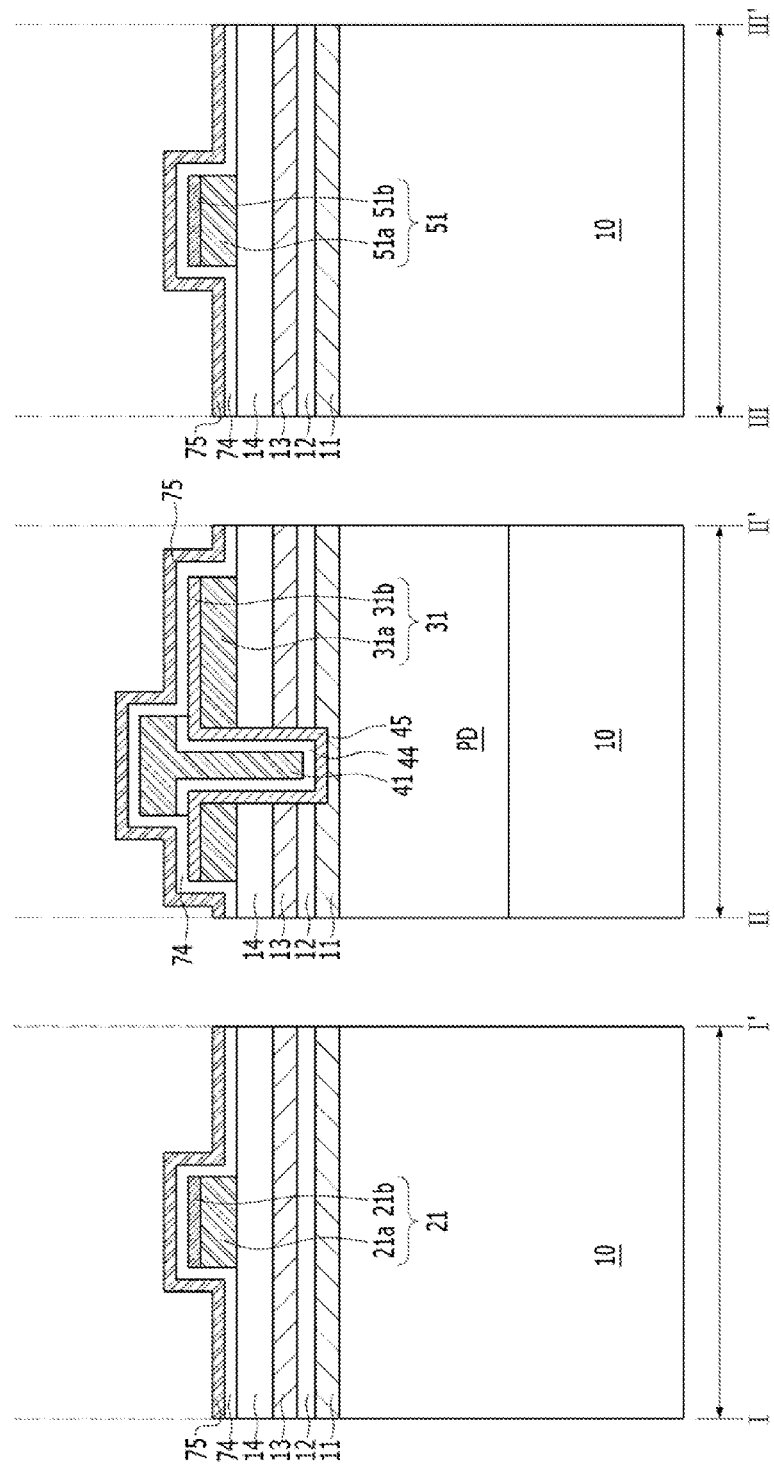
Figure 10B:
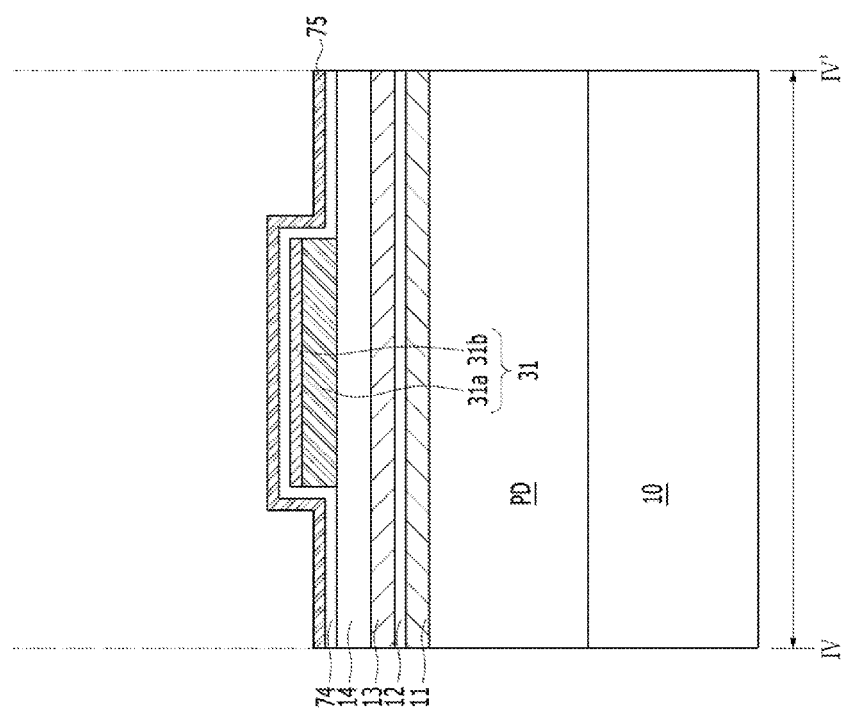

Referring to FIGS. 10A and 10B, the method for fabricating the image sensor in accordance with the embodiment of the inventive concepts may include forming a second gate Insulation layer 74 and a gate channel layer 75 on the profile of the substrate structure. The second gate insulation layer 74 may be formed by conformally forming a silicon oxide layer or a metal oxide layer on the gate electrodes 21, 31, 41 and 51 and the lower interlayer dielectric layer 14 through a deposition process such as a chemical vapor deposition process. According to another embodiment of the inventive concepts, the second gate insulation layer 74 may be formed by selectively oxidizing the exposed surfaces of the gate electrodes 21, 31, 41 and 51. The gate channel layer 75 may be formed by conformally forming a polysilicon layer on the profile of the second gate insulation layer 74 and performing a re-crystallization process. For example, the gate channel layer 75 may Include a doped polysilicon including a p-type impurity or an n-type impurity.

Figure 11A:
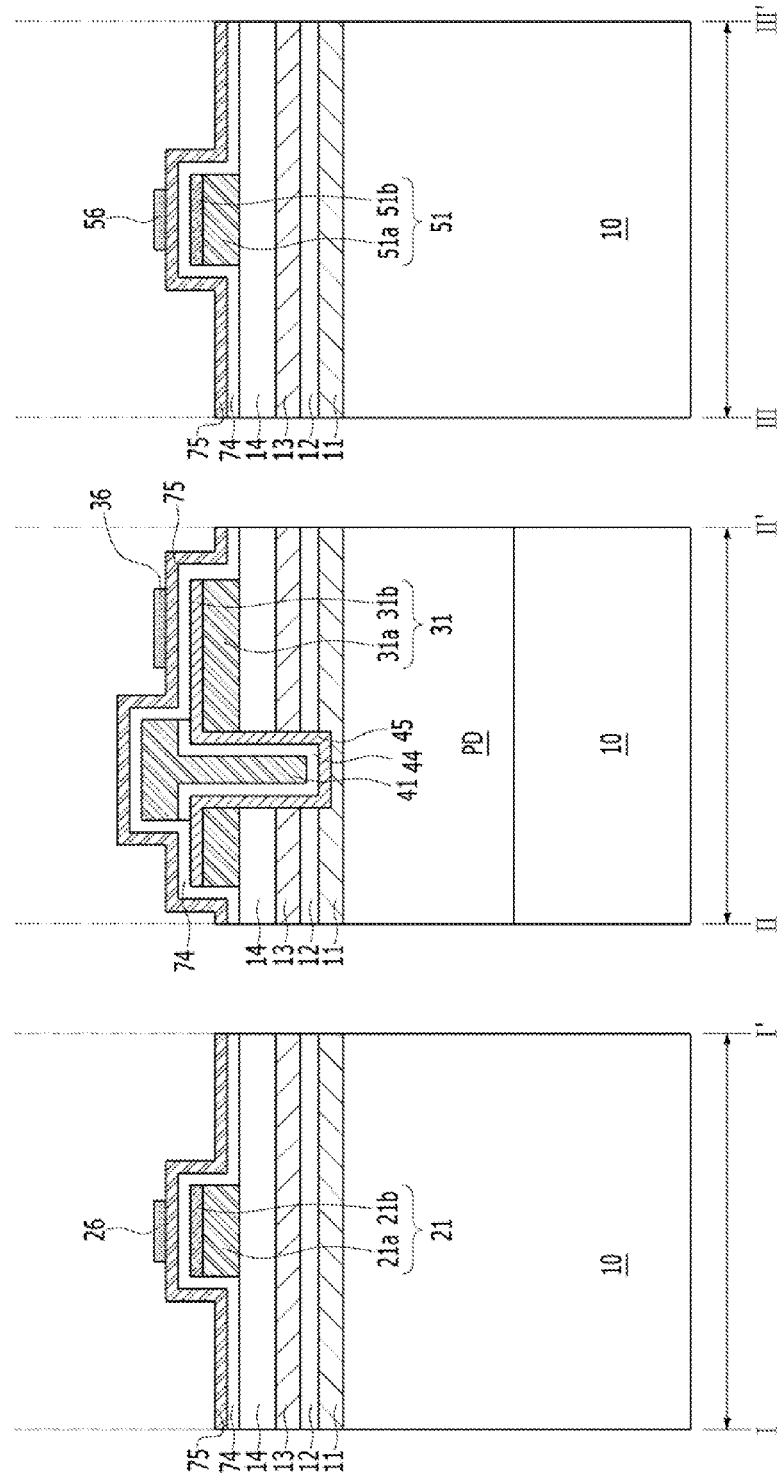

Referring to FIGS. 11A and 11B, the method for fabricating the image sensor in accordance with the embodiment of the inventive concepts may include forming stopping patterns 26, 36 and 56 on the gate channel layer 75. The stopping patterns 26, 36 and 56 include a reset transistor stopping pattern 26 that is vertically overlapping the reset transistor gate electrode 21, a drive transistor stopping pattern 36 that is vertically overlapping the drive transistor gate electrode 31, and a select transistor stopping pattern 56 that is vertically overlapping the select transistor gate electrode 51.

The stopping patterns 26, 36 and 56 may be formed by depositing a dielectric material having an etch selectivity to the gate channel layer 75, such as a silicon nitride, on the profile of the substrate structure through a chemical vapor deposition process and performing a photolithography process and an etch process.

Figure 12A:
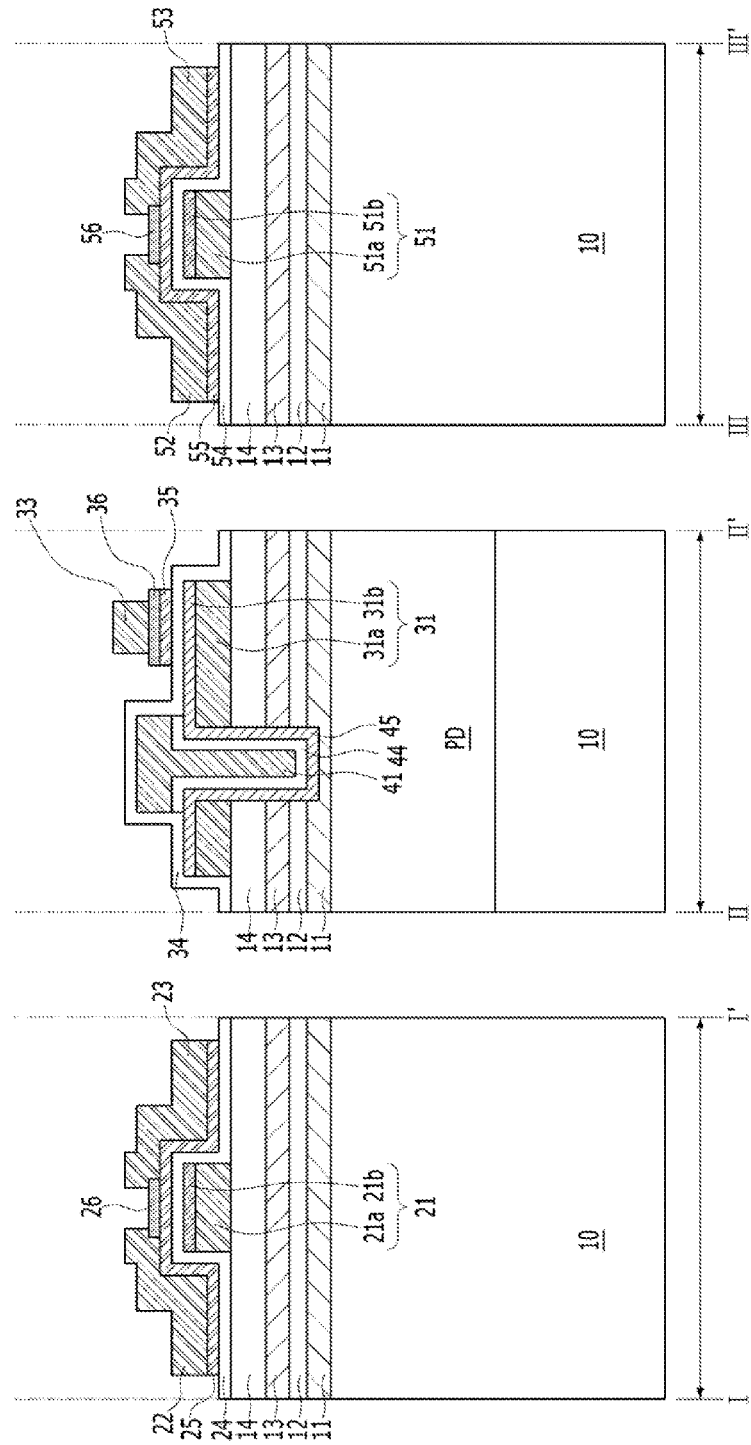
Figure 12B:
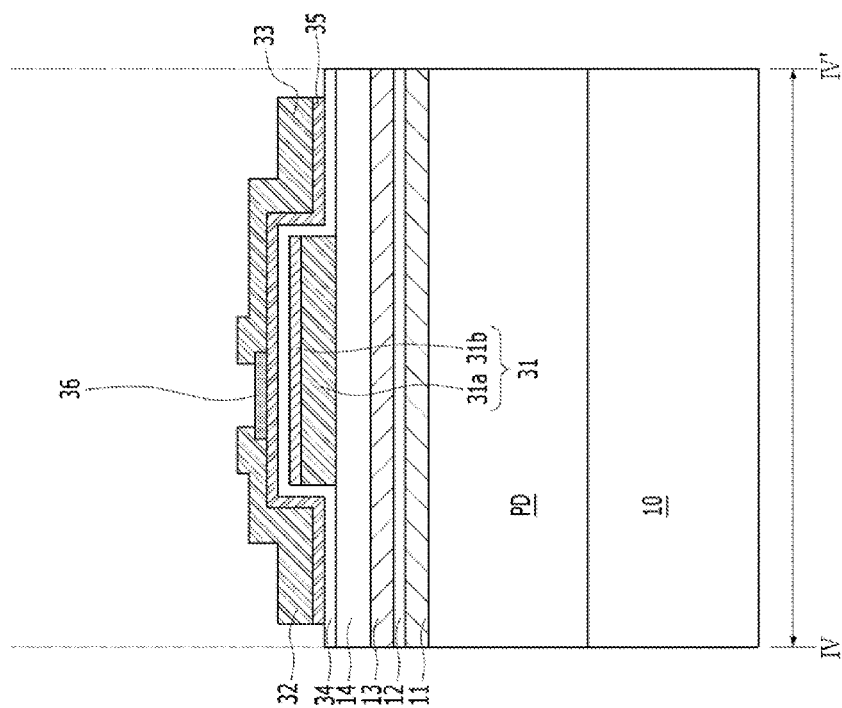

Referring to FIGS. 12A and 12B, the method for fabricating the image sensor in accordance with the embodiment of the inventive concepts may include forming a reset transistor source electrode 22 and a reset transistor drain electrode 23, a drive transistor source electrode 32 and a drive transistor drain electrode 33, and a select transistor source electrode 52 and a select transistor drain electrode 53 by forming an electrode material layer such as a doped polysilicon on the profile of the substrate structure and performing a photolithography process and an etch process.

The second gate insulation layer 74 may be patterned to form a reset transistor gate insulation layer 24, a drive transistor gate insulation layer 34, and a select transistor gate Insulation layer 54. The gate channel layer 75 may be patterned to form a reset transistor channel layer 25, a drive transistor channel layer 35, and a select transistor channel layer 55. The reset transistor stopping pattern 26, the drive transistor stopping pattern 36, and the select transistor stopping pattern 56 may protect the reset transistor channel layer 25, the drive transistor channel layer 35, and the select transistor channel layer 55 from an attack during the etch process, respectively.

Figure 13A:
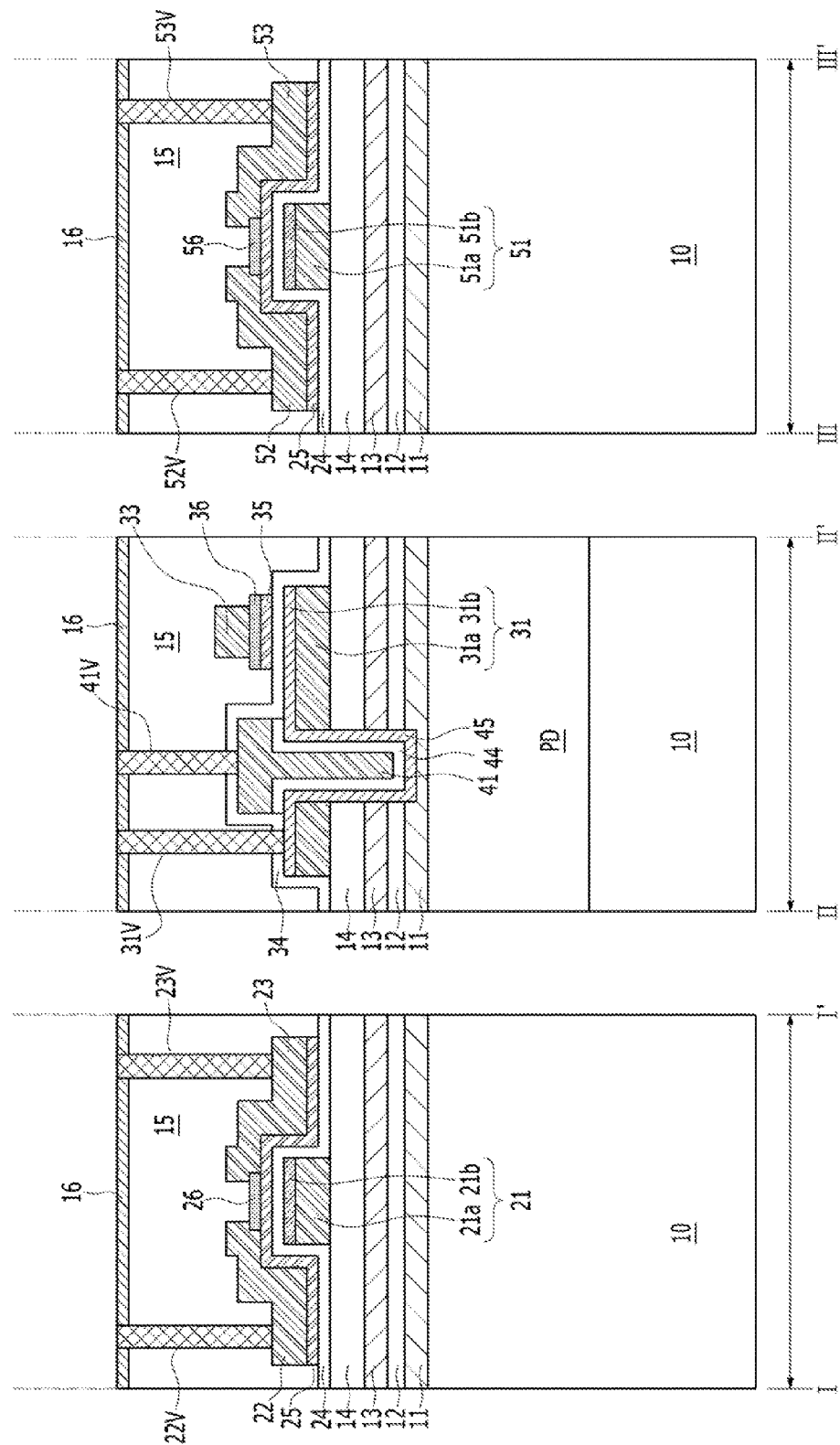
Figure 13B:
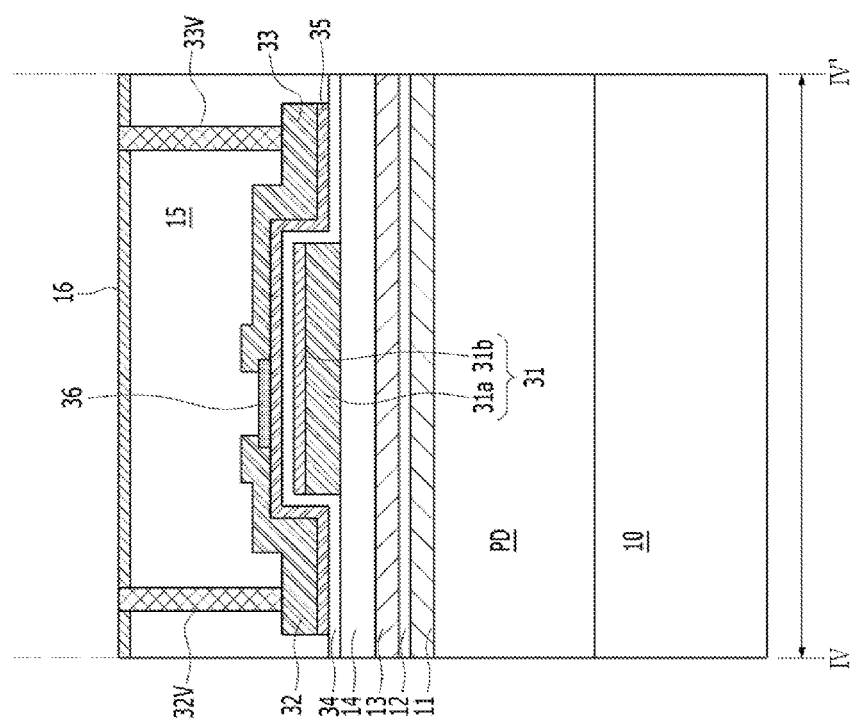

Referring to FIGS. 13A and 13B, the method for fabricating the Image sensor in accordance with the embodiment of the inventive concepts may include forming an upper interlayer dielectric layer 15 over the resultant structure, forming a capping dielectric layer 16 on the upper interlayer dielectric layer 15, and forming vias 22V, 23V, 31V, 32V, 33V, 41V, 52V and 53V that pass through the capping dielectric layer 16 and the upper Interlayer dielectric layer 15. The vias 22V, 23V, 31V, 32V, 33V, 41V, 52V and 53V include a reset transistor source via 22V coupled to the reset transistor source electrode 22, a reset transistor drain via 23V coupled to the reset transistor drain electrode 23, a drive transistor gate via 31V coupled to the drive transistor gate electrode 31, a drive transistor source via 32V coupled to the drive transistor source electrode 32, a drive transistor drain via 33V coupled to the drive transistor drain electrode 33, a transfer transistor gate via 41V coupled to the transfer transistor gate electrode 41, a select transistor source via 52V coupled to the select transistor source electrode 52, and a select transistor drain via 53V coupled to the select transistor drain electrode 53.

The upper interlayer dielectric layer 15 may be formed of a silicon oxide layer by performing a deposition process or a coating process. The capping dielectric layer 16 may be formed of a silicon nitride layer by performing a deposition process. The vias 22V, 23V, 31V, 32V, 33V, 41V, 52V and 53V may be formed by performing a photolithography process and an etch process to form holes that vertically pass through the capping dielectric layer 16 and the upper interlayer dielectric layer 15, and filling the holes with a conductor such as a doped polysilicon.

Subsequently, referring back to FIGS. 3A and 3B, the method for fabricating the Image sensor in accordance with the embodiment of the inventive concepts may include forming interconnections 22I, 23I, 31I, 32I, 33I, 41I, 52I and 53I on the vias 22V, 23V, 31V, 32V, 33V, 41V, 52V and 53V by performing a photolithography process and an etch process. According to other embodiments of the inventive concepts, the vias 22V, 23V, 31V, 32V, 33V, 41V, 52V and 53V and the interconnections 22I, 23I, 31I, 32I, 33I, 41I, 52I and 53I may be formed through a single Damascene process or a Dual Damascene process.

Figure 14:
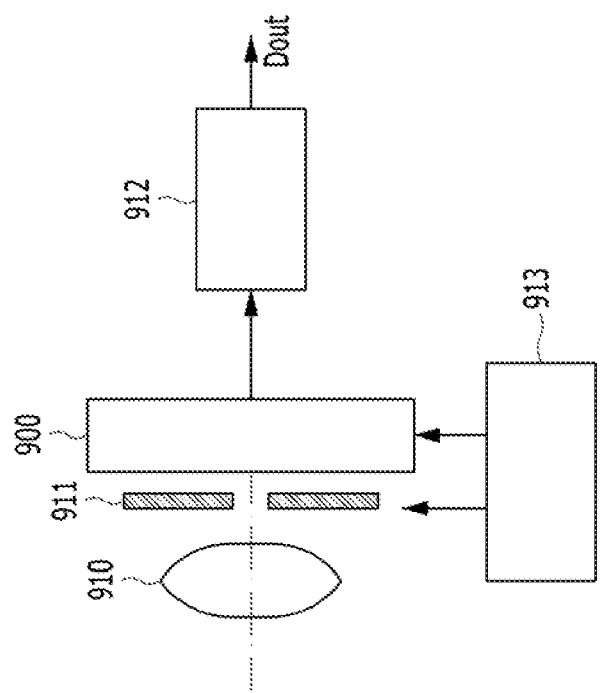
FIG. 14 is a schematic diagram illustrating an electronic device including an image sensor in accordance with an embodiment of the inventive concepts.

FIG. 14 is a schematic diagram illustrating an electronic device including an image sensor in accordance with an embodiment of the inventive concepts. Referring to FIG. 14, the electronic device including the image sensor having at least one among the unit pixels PX1 and PX2 in accordance with diverse embodiments of the inventive concepts may include a camera for taking still images or moving pictures. The electronic device may include an optical system 910 or an optical lens, a shutter unit 911, an Image sensor 900, and a controller 913 for controlling/driving the shutter unit 911, and a signal processor 912.

The optical system 910 guides optical image from a subject to a pixel array (refer to a reference numeral "810" of FIG. 1) of the image sensor 900. The optical system 910 may be formed of optical lenses. The shutter unit 911 controls the length of time for exposing the image sensor 900 to light and shutting it off. The controller 913 controls a transfer operation of the image sensor 900 and a shutter operation of the shutter unit 911. The signal processor 912 processes diverse kinds of signals outputted from the image sensor 900. Image signals Dout outputted after the signal processing is stored in a storage medium, such as a memory, or outputted to a monitor.

According to an embodiment of the inventive concepts, the image sensor includes a transfer transistor having a vertical channel. Thus, the area occupied by a photodiode may increase and the transfer transistor may operate fast.

According to an embodiment of the inventive concepts, the pixel transistors include a reversed thin film transistor structure. Therefore, the pixel transistors may be formed on insulation regions, such as isolation regions. Since the pixel transistors not need to be formed on active regions, most of the active regions may be occupied by photodiodes. Thus, the area occupied by a photodiode increases in a given device size.

Since the reverse thin film transistor structure according to an embodiment of the inventive concepts includes channel layers that partially surround an upper surface and sides of a gate electrode, the channel width of the pixel transistors may be widened.

The image sensor according to an embodiment of the inventive concepts may have excellent optical sensing capability and high resolution since the area occupied by a photodiode increases.

The image sensor according to an embodiment of the inventive concepts effectively decreases dark current due to a floating diffusion of a capacitor structure. While the inventive concepts has been described with respect to the specific embodiments, it will be apparent to those skilled in the art that various changes and modifications may be made without departing from the spirit and scope of the invention as defined in the following claims.

What is claimed is:
1. An image sensor, comprising:
a photodiode formed in a substrate;
a lower interlayer dielectric layer formed over the substrate;
a drive transistor gate electrode formed over the lower interlayer dielectric layer; and
a transfer transistor gate electrode including an upper portion and a lower portion,
wherein the upper portion of the transfer transistor gate electrode is formed over the drive transistor gate electrode, and
wherein the lower portion of the transfer transistor gate electrode is formed in a pillar shape and vertically extends from the upper portion of the transfer transistor gate electrode through the drive transistor gate electrode and the lower interlayer dielectric layer into the substrate.

2. The image sensor of claim 1, further comprising:
a surface p-type region formed in the substrate;
a buffer dielectric layer provided between the substrate and the lower interlayer dielectric layer and including a silicon oxide; and
a pad dielectric layer provided between the lower interlayer dielectric layer and the buffer dielectric layer and including a silicon nitride.

3. The image sensor of claim 1, wherein the drive transistor gate electrode includes:
a drive transistor main gate electrode; and
a drive transistor capping gate electrode directly formed on the drive transistor main gate electrode.

4. The image sensor of claim 3,
wherein the drive transistor main gate electrode includes a doped polysilicon, and
wherein the drive transistor capping gate electrode includes a re-crystallized doped polysilicon.

5. The image sensor of claim 3, further comprising:
a transfer transistor gate insulation layer that surrounds the lower portion of the transfer transistor gate electrode and further extends under the upper portion of the transfer transistor gate electrode; and
a transfer transistor channel layer formed under the transfer transistor gate insulation layer, wherein the drive transistor capping gate electrode and the transfer transistor channel layer include the same material and are continuously connected to each other.

6. The image sensor of claim 5, wherein the transfer transistor channel layer includes a re-crystallized doped polysilicon.

7. The image sensor of claim 3, further comprising:
a drive transistor gate insulation layer that is conformally formed over an upper surface and a sidewall of the drive transistor gate electrode;
a drive transistor channel layer that is formed over the drive transistor gate insulation layer; and
a drive transistor source electrode and a drive transistor drain electrode formed over the drive transistor channel layer and spaced apart from each other.

8. The Image sensor of claim 7, further including:
a drive transistor protective pattern that is formed over the drive transistor channel layer and between the drive transistor source electrode and the drive transistor drain electrode.

9. The image sensor of claim 7,
wherein the drive transistor gate insulation layer further extends to conformally cover an upper surface and a sidewall of the upper portion of the transfer transistor gate electrode.

10. The image sensor of claim 1, further comprising:
a reset transistor and a select transistor formed over the lower interlayer dielectric layer,
wherein the reset transistor includes:
    a reset transistor gate electrode formed over the lower interlayer dielectric layer;
    a reset transistor gate insulation layer that covers an upper surface of a sidewall of the reset transistor gate electrode;
    a reset transistor channel layer formed over the reset transistor gate insulation layer; and
    a reset transistor source electrode and a reset transistor drain electrode formed over the reset transistor channel layer and spaced apart from each other,
wherein the reset transistor gate electrode includes a stack of a reset transistor main gate electrode and a reset transistor capping gate electrode,
wherein the select transistor includes:
    a select transistor gate electrode formed over the lower interlayer dielectric layer;
    a select transistor gate insulation layer that covers an upper surface of a sidewall of the select transistor gate electrode;
    a select transistor channel layer formed over the select transistor gate insulation layer; and
    a select transistor source electrode and a select transistor drain electrode formed over the select transistor channel layer and spaced apart from each other, and
wherein the select transistor gate electrode includes a stack of a select transistor main gate electrode and a select transistor capping gate electrode.

11. The image sensor of claim 10,
wherein each of the reset transistor main gate electrode and the select transistor main gate electrode includes a doped polysilicon, and
wherein each of the reset transistor capping gate electrode and the select transistor capping gate electrode includes a re-crystallized doped polysilicon.

12. The image sensor of claim 10,
wherein the reset transistor further includes a reset transistor protective pattern that is formed over the reset transistor channel layer and between the reset transistor source electrode and the reset transistor drain electrode, and wherein the select transistor further includes a select transistor protective pattern that is formed over the select transistor channel layer and between the select transistor source electrode and the select transistor drain electrode.

13. An image sensor, comprising:
a photodiode formed in a substrate;
a lower interlayer dielectric layer formed over the substrate;
a reset transistor gate electrode, a drive transistor gate electrode, and a select transistor gate electrode which are formed over the lower interlayer dielectric layer;
a reset transistor gate insulation layer, a drive transistor gate insulation layer, and a select transistor gate insulation layer that are formed over the lower interlayer dielectric layer and conformally cover upper surfaces and sidewalls of the reset transistor gate electrode, the drive transistor gate electrode, and the select transistor gate electrode, respectively;
a reset transistor channel layer, a drive transistor channel layer, and a select transistor channel layer formed over the reset transistor gate insulation layer, the drive transistor gate insulation layer, and the select transistor gate insulation layer, respectively;
a reset transistor source electrode and a reset transistor drain electrode which are formed over the reset transistor channel layer;
a drive transistor source electrode and a drive transistor drain electrode which are formed over the drive transistor channel layer;
a select transistor source electrode and a select transistor drain electrode which are formed over the select transistor channel layer; and
a transfer transistor gate electrode including an upper portion and a lower portion,
wherein the upper portion of the transfer transistor gate electrode is formed over the drive transistor gate electrode, and
wherein the lower portion of the transfer transistor gate electrode is formed in a pillar shape and vertically extends from the upper portion of the transfer transistor gate electrode through the drive transistor gate electrode and the lower interlayer dielectric layer into the substrate.

14. The image sensor of claim 13, further comprising:
a transfer transistor gate insulation layer that surrounds the lower portion of the transfer transistor gate electrode; and
a transfer transistor channel layer formed under the transfer transistor gate insulation layer,
wherein the transfer transistor channel layer directly contacts a sidewall of the drive transistor gate electrode.

15. The image sensor of claim 14,
wherein the drive transistor gate electrode includes a stack of a drive transistor main gate electrode and a drive transistor capping gate electrode, and wherein the drive transistor capping gate electrode and the transfer transistor channel layer include the same material and are continuously connected to each other.

16. The image sensor of claim 13, wherein each of the drive transistor gate electrode and the transfer transistor gate electrode vertically overlaps with the photodiode.

17. An image sensor, comprising:
a lower interlayer dielectric layer formed over a substrate;
a reset transistor main gate electrode and a drive transistor main gate electrode which are formed over the lower interlayer dielectric layer;
a reset transistor capping gate electrode formed over the reset transistor main gate electrode;
a drive transistor capping gate electrode formed over the drive transistor main gate electrode;
a reset transistor gate insulation layer formed over the reset transistor capping gate electrode;
a drive transistor gate insulation layer formed over the drive transistor capping gate electrode;
a reset transistor channel layer formed over the reset transistor gate insulation layer;
a drive transistor channel layer formed over the drive transistor gate insulation layer;
a reset transistor source electrode and a reset transistor drain electrode which are formed over the reset transistor channel layer and spaced apart from each other;
a drive transistor source electrode and a drive transistor drain electrode which are formed over the drive transistor channel layer and spaced apart from each other;
a transfer transistor gate electrode including an upper portion and a lower portion, wherein the upper portion of the transfer transistor gate electrode is formed over the drive transistor capping gate electrode, wherein the lower portion of the transfer transistor gate electrode is formed in a pillar shape and vertically extends from the upper portion of the transfer transistor gate electrode through the drive transistor gate electrode and the lower interlayer dielectric layer into the substrate;
a transfer transistor gate insulation layer that surrounds a lower portion of the transfer transistor gate electrode; and
a transfer transistor channel layer formed under the transfer transistor gate Insulation layer,
wherein the drive transistor capping gate electrode and the transfer transistor channel layer include the same material and are continuously connected to each other.

18. The image sensor of claim 17, wherein an area in which the drive transistor main gate electrode overlaps the drive transistor drain electrode is greater than an area in which the drive transistor main gate electrode overlaps the drive transistor source electrode.

19. The image sensor of claim 18, wherein each of the transfer transistor gate electrode, the transfer transistor gate insulation layer, and the transfer transistor channel layer vertically passes through the drive transistor main gate electrode and the lower interlayer dielectric layer.

\* \* \* \* \*